United States Patent
Pandey

(10) Patent No.: US 11,206,174 B2
(45) Date of Patent: Dec. 21, 2021

(54) METHOD AND SYSTEM FOR DIAGNOSIS OF FAILURES IN A COMMUNICATIONS NETWORK

(71) Applicant: NXP B.V., Eindhoven (NL)

(72) Inventor: Sujan Pandey, Waalre (NL)

(73) Assignee: NXP B.V., Eindhoven (NL)

( * ) Notice: Subject to any disclaimer, the term of this patent is extended or adjusted under 35 U.S.C. 154(b) by 101 days.

(21) Appl. No.: 16/177,342

(22) Filed: Oct. 31, 2018

(65) Prior Publication Data

US 2020/0136896 A1 Apr. 30, 2020

(51) Int. Cl.
*H04L 12/14* (2006.01)
*H04L 12/24* (2006.01)
*G01R 31/08* (2020.01)
*G01R 31/30* (2006.01)
*H04L 12/40* (2006.01)
*G01R 31/50* (2020.01)

(52) U.S. Cl.
CPC .......... *H04L 41/0672* (2013.01); *G01R 31/08* (2013.01); *G01R 31/3004* (2013.01); *G01R 31/50* (2020.01); *H04L 12/40* (2013.01); *H04L 41/0816* (2013.01); *H04L 2012/40215* (2013.01); *H04L 2012/40273* (2013.01)

(58) Field of Classification Search
CPC .............. G01R 19/16576; G01R 31/08; G01R 31/3004; G01R 31/31716; G01R 31/50; H04B 17/14; H04L 12/40; H04L 1/0057; H04L 1/243; H04L 2012/40215; H04L 2012/40273; H04L 2012/5627; H04L 41/06
See application file for complete search history.

(56) References Cited

U.S. PATENT DOCUMENTS

| | | | |
|---|---|---|---|
| 6,363,065 B1* | 3/2002 | Thornton | H04L 12/14 370/352 |
| 9,323,311 B2* | 4/2016 | Diab | H04L 12/12 |
| 9,866,425 B1* | 1/2018 | Lo | H04L 41/042 |
| 2006/0107138 A1* | 5/2006 | Moriwaki | H04B 10/40 714/724 |
| 2007/0214288 A1* | 9/2007 | Wehrle | H04L 61/2038 710/8 |
| 2009/0238080 A1* | 9/2009 | Hirano | H04L 45/18 370/241 |
| 2010/0040363 A1* | 2/2010 | Zhou | H04B 10/07953 398/10 |

(Continued)

*Primary Examiner* — Omer S Mian
*Assistant Examiner* — Bao G Nguyen

(57) ABSTRACT

Embodiments of a method and a device are disclosed. In an embodiment, a method for operating a communications network is disclosed. The method involves setting, at a first network node in the communications network, a register value that is indicative of a fault status associated with the first network node, the register value being set in a physical layer device of the first network node, receiving fault status information at an element in the communications network, the fault status information corresponding to the register value that is set in the physical layer device of the first network node, and determining, at the element in the communications network, a fault status of the communications network in response to the fault status information received at the element in the communications network.

15 Claims, 21 Drawing Sheets

(56) References Cited

U.S. PATENT DOCUMENTS

| | | | | |
|---|---|---|---|---|
| 2010/0260498 | A1* | 10/2010 | Kim | H04J 3/1694 |
| | | | | 398/45 |
| 2015/0296057 | A1* | 10/2015 | Ohana | H04L 69/323 |
| | | | | 370/437 |
| 2018/0287911 | A1* | 10/2018 | Gray | H04L 43/0811 |

* cited by examiner

METHOD AND SYSTEM FOR DIAGNOSIS OF FAILURES IN A COMMUNICATIONS NETWORK

BACKGROUND

Modern automobiles include various electronic control units (ECUs) that implement, for example, engine control, power train control, airbag systems, antilock brake systems, cruise control, electric power steering, audio systems, window control systems, door control systems, mirror adjustment systems, and battery and recharging systems for hybrid/electric cars. The ECUs communicate with each other in an automobile via in-vehicle network (IVN) technologies such as Ethernet, Controller Area Network (CAN), and FlexRay.

SUMMARY

Embodiments of a method and a device are disclosed. In an embodiment, a method for operating a communications network is disclosed. The method involves setting, at a first network node in the communications network, a register value that is indicative of a fault status associated with the first network node, the register value being set in a physical layer device of the first network node, receiving fault status information at an element in the communications network, the fault status information corresponding to the register value that is set in the physical layer device of the first network node, and determining, at the element in the communications network, a fault status of the communications network in response to the fault status information received at the element in the communications network.

In an embodiment, the method involves at the first network node reading the register value that is set in the physical layer device, based on the read register value, embedding an indication of the fault status into a bit stream at the physical layer of the first network node, and transmitting the bit stream from the first network node.

In an embodiment, embedding an indication of the fault status into a bit stream at the physical layer comprises embedding an operations, administration, and management (OAM) word into the bit stream to communicate the indication of the fault status.

In an embodiment, the OAM word is embedded into the bit stream at a physical coding sublayer transmitter (PCS-TX) of the first network node.

In an embodiment, the method involves receiving the bit stream at a receiver of a second network node, at the second network node, extracting the indication of the fault status from the bit stream, providing the indication of the fault status to the element in the communications network, and determining the fault status of the communications network at the element in the communications network in response to the fault status information received at the second network node from the first network node.

In an embodiment, the method further involves at a second network node receiving the bit stream at a receiver of the second network node, extracting the indication of the fault status from the bit stream, configuring the second network node using the indication of the fault status, and operating the second network node as configured using the indication of the fault status.

In an embodiment, the method involves detecting a low voltage condition at the physical layer device of the first network node and setting the register value in response to detecting the low voltage condition.

In an embodiment, the method involves detecting an open/short circuit condition at the physical layer device of the first network node and setting the register value in response to detecting the open/short circuit condition.

In an embodiment, the method involves performing a loop test at the first network node and setting the register value in response to the loop test.

In an embodiment, the register value is indicative of a fault in the physical layer device of the first network node.

In an embodiment, the register value is indicative of a fault in a microcontroller of the first network node.

An embodiment of a communications network is disclosed. The communications network includes multiple network nodes, the multiple network nodes including a physical layer device, the physical layer device including a transmitter configured to transmit a bit stream from the physical layer device, a receiver configured to receive a bit stream at the physical layer device, and fault status logic that includes a register for storing a register value that is indicative of a fault status associated with the network node, and at least one element in the communications network is configured to determine a fault status of the communications network in response to the register value that is stored in the register of the fault status logic.

In an embodiment of the communications network, the fault status logic is configured to identify a fault status at a first network node, set the register with a register value that is indicative of the fault status, and provide an indication of the identified fault status to the transmitter.

In an embodiment of the communications network, the transmitter is configured to embed an OAM word into a bit stream before transmission of the bit stream, the OAM word including the indication of the fault status provided by the fault status logic.

In an embodiment, the communications network includes a low voltage detector configured to detect a low voltage condition in a physical layer device and to provide an indication of the low voltage condition to the corresponding fault status logic.

In an embodiment, the communications network includes an open/short circuit detection circuit configured to detect an open/short circuit condition in a physical layer device and to provide an indication of the open/short circuit condition to the corresponding fault status logic.

In an embodiment, the communications network includes a loopback testing circuit and wherein the fault status logic comprises a register for storing a result of a loopback test that is performed using the loopback testing circuit.

In an embodiment, the fault status logic comprises a microcontroller evaluation circuit configured to evaluate a fault status of a microcontroller.

Another embodiment of a communications network is disclosed. The communications network includes a first network node including a physical layer device, the physical layer device including a transmitter configured to transmit a bit stream from the physical layer device, a receiver configured to receive a bit stream at the physical layer device, and fault status logic that includes a register for storing a register value that is indicative of a fault status associated with the network node, the fault status logic configured to provide to the transmitter an indication of the fault status that corresponds to the stored register value a second network node including a physical layer device, the physical layer device including a transmitter configured to transmit a bit stream from the physical layer device, a receiver configured to receive a bit stream at the physical layer device, and fault status logic that includes a register for storing a register value that is indicative of a fault status associated with the network node, the fault status logic configured to provide to the transmitter an indication of the fault status that corresponds to the stored register value, and at least one element in the communications network is configured to determine a fault status of the communications network in response to a register value that is stored in the register of the fault status logic of at least one of the first network and the second network node.

In an embodiment of the communications network, the transmitters are configured to embed an OAM word into a bit stream before transmission of the bit stream, the OAM word including the indication of the fault status provided by the fault status logic based on the register value stored in the register.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
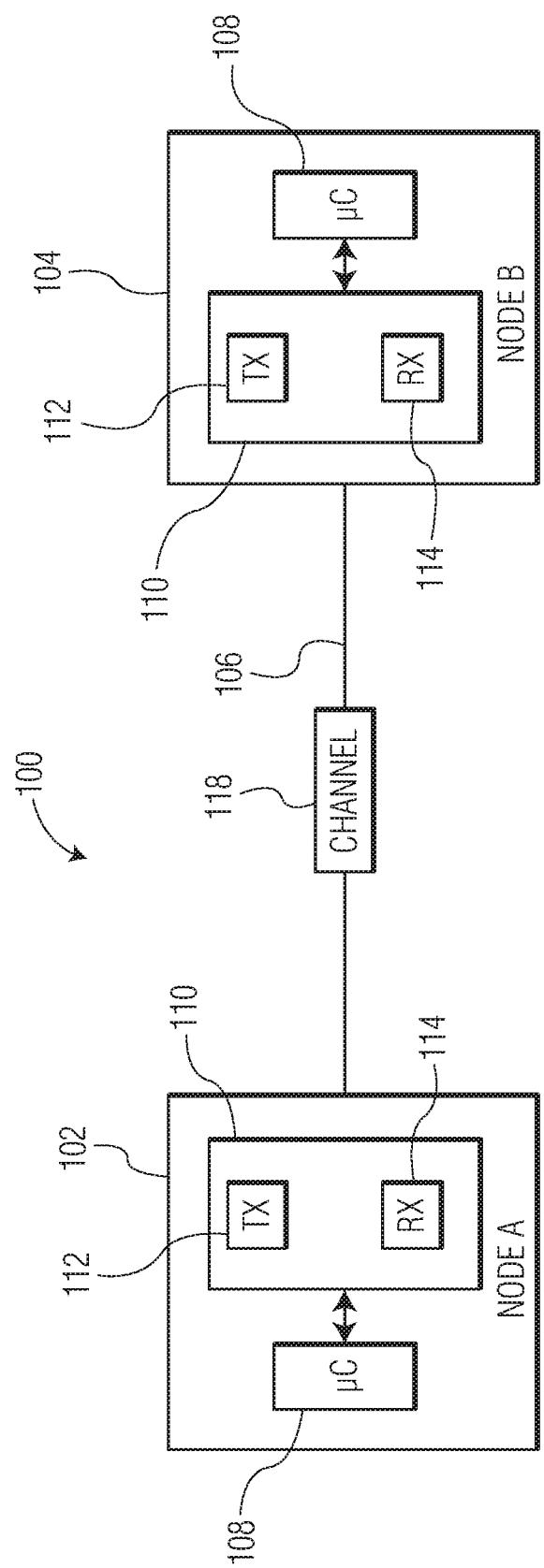
FIG. 1 depicts a communications network that connects two nodes via a physical link.

FIG. 1 depicts a communications network 100 that connects two nodes, node A 102 and node B 104, via a communications medium 106 such as an unshielded twisted pair of copper wires, e.g., 10BASE-T1L. In an embodiment, the network is an in-vehicle network (IVN) that uses Ethernet at the data link layer, as specified in the Open Systems Interconnection (OSI) model as published by the International Organization for Standardization (ISO). Each node includes a microcontroller 108 and a transceiver 110 that includes a transmitter 112 and a receiver 114. Data is communicated in a channel 118 across the communications medium 106. In an embodiment, a channel may be a logical channel that is specified at a layer higher than the physical layer. As used herein, a link or a communications link refers to a communications pathway that is supported by the communications medium, such as twisted pair wires or a single conductor based coax cable, and various communications protocols that are implemented at different layers in the OSI mode to achieve successful data communications between two or more nodes. Although FIG. 1 shows only two nodes in the communications network, the communications network may include more than two nodes. In general, high speed Ethernet (e.g., greater than 10 Mbits/s) uses point-to-point network configurations but there are network configurations that involve point-to-multipoint. The techniques described herein are applicable to point-to-point and point-to-multipoint network configurations. Further, although in some embodiments an Ethernet-based network is described, it should be noted that the invention is not restricted to a specific type of network. The communications network may be, for example, an in-vehicle network (IVN) that utilizes a network technology such as Controller Area Network (CAN), Local Interconnect Network (LIN), Media Oriented Systems Transport (MOST), or FlexRay™. The communications network can be used to enable communications between, for example, various electronic control units (ECUs), such as an engine control module (ECM), a power train control module (PCM), airbags, antilock brakes, cruise control, electric power steering, audio systems, windows, doors, mirror adjustment, battery and recharging systems for hybrid/electric cars, and many more.

In some embodiments, the microcontrollers 108 are connected to at least one device (not shown) such as a sensor, an actuator, or some other control device and are programmed to determine the meaning of received messages and to generate appropriate outgoing messages. In some embodiments, at least one of the microcontrollers includes a host (not shown), which may include, for example, a software application that is stored in memory of the microcontroller and executed by processing circuits of the microcontroller. The microcontrollers, also referred to as host processors, hosts, or digital signal processors (DSPs), are known in the field. In an embodiment, the microcontrollers 108 implement data link layer (i.e., Layer 2) operations as is known in the field, which in an Ethernet-based network may include Logical Link Control (LLC) sublayer operations and/or media access control (MAC) sublayer operations. For example, in a receive operation, a microcontroller stores received serial bits from a corresponding transceiver 110. In a transmit operation, the microcontroller may transmit a message as serial bits in a data frame format to the corresponding transceiver. The microcontrollers may be implemented as, for example, digital signal processors (DSPs) and/or central processing units (CPUs).

The transceivers 110 are located between the microcontrollers 108 and the communications medium 106 and implement physical layer operations. For example, in receive operations, the receivers 114 convert analog signals from the communications medium to digital signals that a corresponding microcontroller can interpret. In an embodiment, the receivers 114 include a DSP to process incoming signals. The transceiver also can protect the microcontroller from extreme electrical conditions on the communications medium, e.g., electrical surges. In transmit operations, the transmitters 112 convert digital bits received from the microcontroller into analog signals that are sent on the communications medium. The transceivers may be any suitable type of transceivers. In some embodiments, the transceivers are Ethernet transceivers. For example, the transceivers may be Institute of Electrical and Electronics Engineers (IEEE) 802.3 compatible Ethernet transceivers. The transceivers may be implemented in suitable analog circuits and/or digital circuits.

In the communications network 100 depicted in FIG. 1, the nodes 102 and 104 are connected to the communications medium 106, which carries analog signals between the communications devices. The communications medium may include one or more conductive wires or lines, which are made of conductive materials (e.g., metals). For example, the communications medium may include one or more coaxial cables, twisted pair cables, or fiber optic cables. In some embodiments, the communications medium includes a communications bus, which carries analog differential signals and includes a high bus line and a low bus line, which may be connected between one or more resistors. However, the network topology of the communications network is not limited to bus topology. Examples of the network topology that can also be used by the communications network includes point-to-point, star, ring or circular, mesh, tree, hybrid, and daisy chain, which are known in the field.

At the physical layer, encoding, such as Forward Error Correction (FEC) encoding, has been used to improve the quality of point-to-point communications across an Ethernet link, for example, to improve the Bit Error Rate (BER) or to meet a minimum BER requirement. At the physical layer, the receivers typically include a decoder, e.g., digital decoder that is implemented in a DSP. The decoder includes processing blocks (e.g., processing blocks of the DSP) for bit decoding and for error detection and correction. DSP processing blocks for bit decoding include, for example, an equalizer block, an echo cancellation block, an automatic gain control (AGC) block, a clock data recovery (CDR) block, and/or a baseline wander (BLW) block. DSP processing blocks for error detection and error correction include, for example, a syndrome calculation block, an error location block, and an error correction block.

In automotive in-vehicle networks, various faults may occur that may inhibit communications between ECUs. Faults may occur within an ECU, including faults that occur at the physical layer (e.g., in the PHY device or PHY chip) and faults that occur at higher layers (e.g., in a microcontroller) and/or faults may occur in the connectors that connect ECUs to the communications medium and faults may occur on the communications medium itself. Faults that may occur at the physical layer (e.g., within a PHY device or PHY chip) include, for example, low voltage faults and open/short circuit faults in the electronics of the physical layer circuits. Faults that may occur at higher layers include failure of the microcontroller that supports higher layer operations. Faults that may occur in the connectors and communications medium include, for example, damaged or broken connectors and/or damaged or broken communications wires.

In accordance with an embodiment of the invention, a technique for performing physical layer operations at a network node in a communications network involves identifying a fault status at the network node, embedding an indication of the fault status into a bit stream at the physical layer of the network node, and transmitting the bit stream from the network node. Identifying a fault status and embedding the fault status into a bit stream at the physical layer of the network node enables a physical layer device to share its fault status with another physical layer device in the communications network. Since the fault status of a physical layer device is shared with another physical layer device, a physical layer device may be able to take some action based on the shared knowledge of the fault status. For example, a node may chose to operate in a fail safe mode (e.g., a low data rate mode) or a node may notify other nodes in the network of the fault status. In an embodiment, embedding an indication of the fault status into a bit stream at the physical layer involves embedding an operations, administration, and management (OAM) word into the bit stream to communicate the indication of the fault status. For example, in an Ethernet network, the OAM word is embedded into the frame at a physical coding sublayer transmitter (PCS-TX) of the first network node. Some types of faults for which it is desirable to be able to share a fault status with other nodes in a network include, for example, a low voltage condition at the physical layer, an open/short circuit condition at the physical layer, a faulty microcontroller, or problems with a connector or cable that supports communications between nodes. For example, with respect to a low voltage condition, a fault status may be low voltage condition=YES or low voltage condition=NO. In another embodiment, a fault status may be simply an indication of "low voltage condition." In an embodiment, a fault status is shared at the physical layer as a fault code, which is generated by the control logic, then encoded into a few OAM bits, and then decoded back to a fault code that can be understood by the control logic. Examples of techniques for identifying such faults are described in more detail below.

Figure 2A:
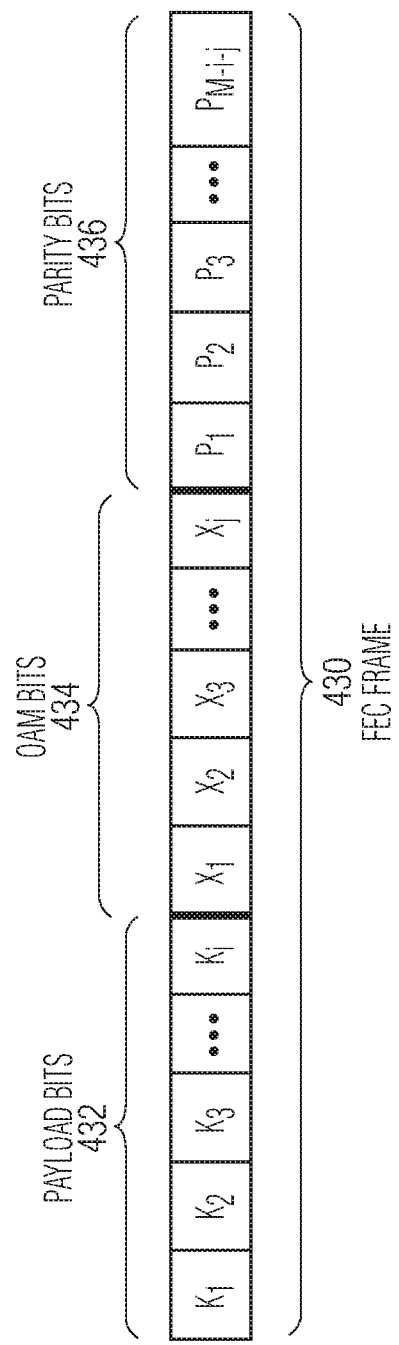
FIG. 2A depicts an example of an FEC frame that can be used to communicate information that is used to set and/or adjust the error management mode in, for example, an Ethernet based in-vehicle network.

As described above, the technique for performing physical layer operations in a communications network involves utilizing an OAM word in an FEC frame. FIG. 2A depicts an example of an FEC frame 230 (M bits) that can be used to communicate information that is used to set and/or adjust the level of interleaving in an Ethernet based in-vehicle network. As depicted in FIG. 2A, the FEC frame 230 includes payload bits 232 (K bits, $K_1, K_2, K_3, \ldots K_i$) and OAM bits 234 (X bits, $X_1, X_2, X_3, \ldots X_j$) (also referred to collectively herein as an "OAM word"), with parity bits 236 (P bits, $P_1, P_2, P_3, \ldots P_{M-i-j}$) interspersed within the payload bits and the OAM bits. In the example of FIG. 2A, the payload bits include bits of data received from a higher layer in the network stack, e.g., from the data link layer and which are intended to be communicated across the link to the same higher layer in the receiving node, the OAM bits include bits of operations, administration, and management information that are communicated between the physical layers (e.g., between the PHY chips) in OAM words, and the parity bits are bits added to strings of binary values in the FEC frame to provide a check on the corresponding bit values in the FEC frame. In an embodiment, an FEC frame is M bits, including K bits of data, X bits of OAM data, and M−K−X parity bits. In an embodiment, an FEC frame makes up a portion of a PDU such as an Ethernet PDU. In an embodiment, FEC may not be used and thus, the parity bits are not included in a frame. An example case in which FEC is not used is described below with reference to FIG. 3B.

Figure 2B:
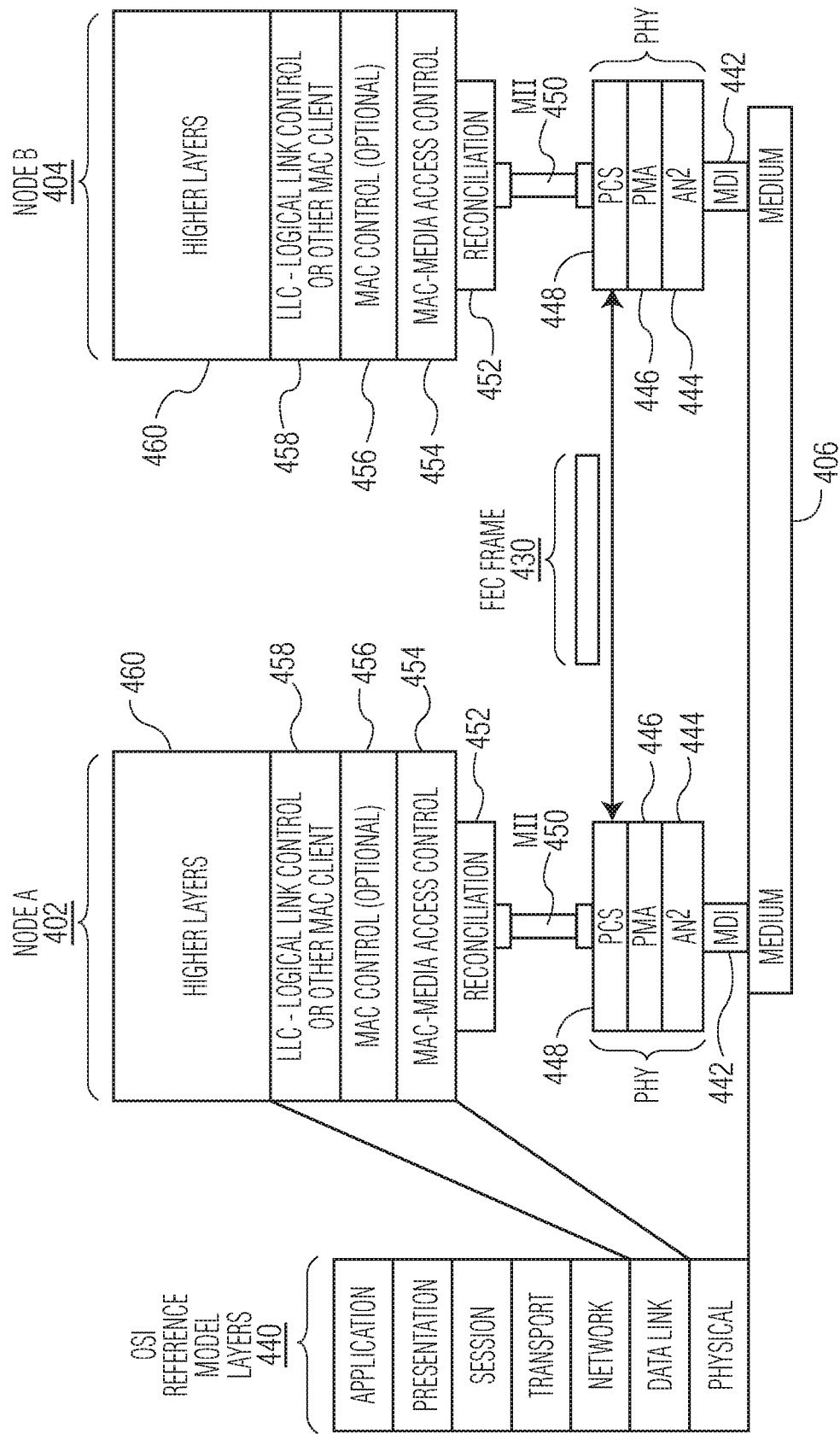
FIG. 2B illustrates the communication of an FEC frame between two nodes in an Ethernet based in-vehicle network.

FIG. 2B illustrates the communication of an FEC frame 230 between two nodes, node A 202 and node B 204, in an Ethernet based in-vehicle network. FIG. 2B depicts the layers of the OSI reference model 240 as well as an expanded view of the physical layer and the data link layer. As shown in FIG. 2B, the OSI reference model includes the physical layer (also referred to as layer 1 or L1), the data link layer (also referred to as layer 2 or L2), the network layer (also referred to as layer 3 or L3), the transport layer (also referred to as layer 4 or L4), the session layer (also referred to as layer 5 or L5), the presentation layer (also referred to as layer 6 or L6), and the application layer (also referred to as layer 7 or L7). Elements in the expanded view of the physical layer include media-dependent sublayers of the transmission medium 206, a media-dependent interface (MDI) 242, an auto-negotiation layer (AN2) 244, a physical medium attachment (PMA) 246, and the physical coding sublayer (PCS) 248, and media-independent sublayers of a media-independent interface (MII) 250, and a reconciliation layer 252. Elements in the expanded view of the data link layer include the media access control (MAC) layer 254, the MAC control layer (optional) 256, and the logical link control (LLC) 258, or other MAC client, layer. Higher layers 260 may be implemented above the data link layer.

Figure 3A:
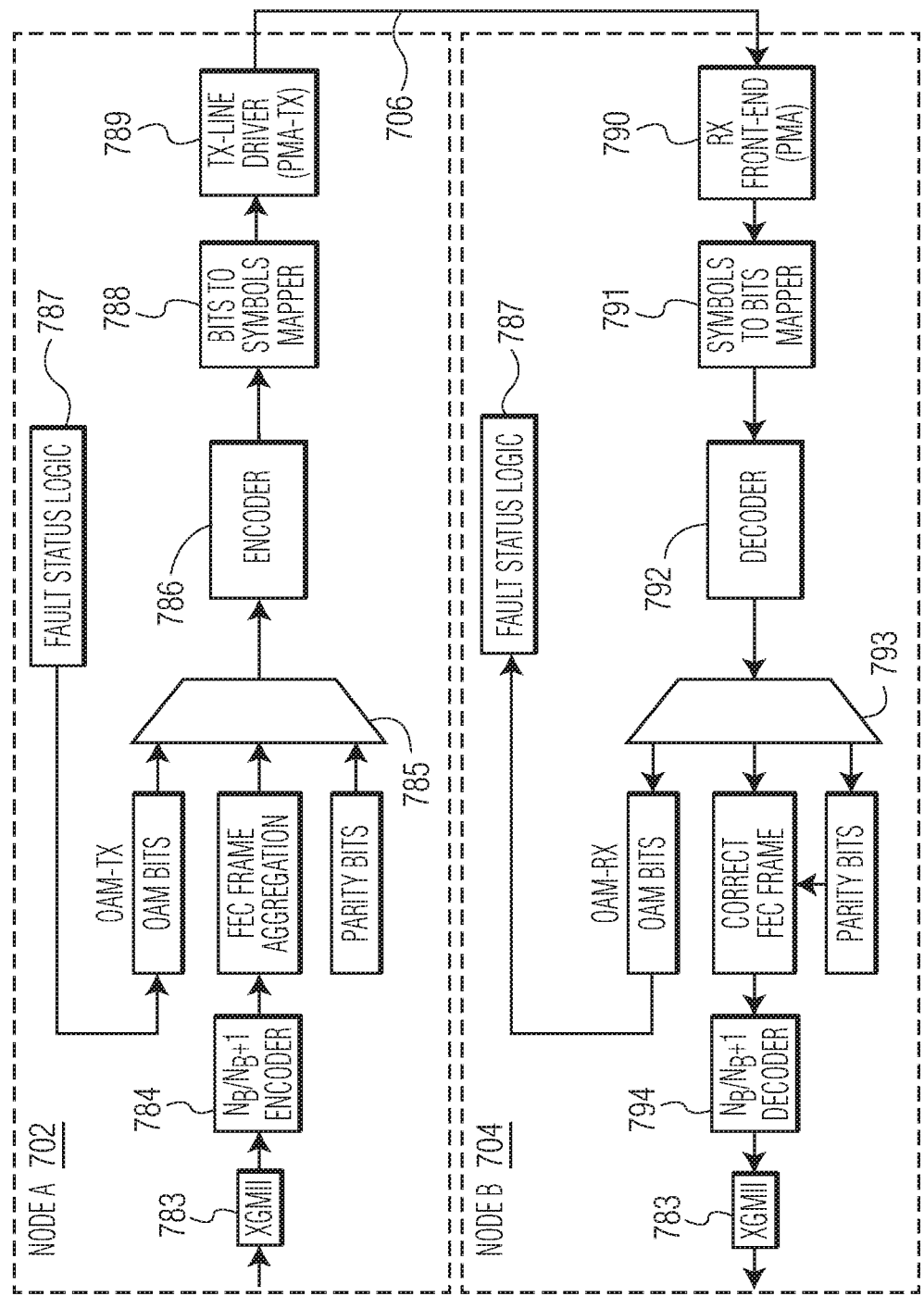
FIG. 3A illustrates the processing of a bit stream as FEC frames at the physical level between two nodes in a network.

FIG. 3A illustrates a process for transmitting and receiving FEC frames at the physical layer between two nodes, node A 302 and node B 304, in a point-to-point network that utilizes, for example, Ethernet. In the example of FIG. 3, node A transmits FEC frames on physical link 306 and node B receives the FEC frames on the physical link. As depicted in FIG. 3A, node A includes a gigabit MII (XGMII) 383, an $N_B/N_B+1$ encoder 384 (wherein $N_B$ is the number of bits in a word), a multiplexer 385, fault status logic 387, an encoder 386, a bits-to-symbols mapper 388, and a TX-line driver (PMA-TX) 389, and node B 304 includes an RX front-end (PMA-RX) 390, a symbols-to-bits mapper 391, a decoder 392, a demultiplexer 393, fault status logic 387, an N/N+1 decoder 394, and a gigabit MII (XGMII) 383. Although the physical layer elements shown in FIG. 3A include an $N_B/N_B+1$ encoder 384 and an $N_B/N_B+1$ decoder 394, in other embodiments the $N_B/N_B+1$ encoder and decoder may use some other type of encoding/decoding or the $N_B/N_B+1$ encoder and decoder may be omitted.

In operation (described from transmission to reception), a bitstream is received at node A 302 (e.g., at a PHY chip) via the XGMII 383 and passed to the $N_B/N_B+1$ encoder 384 for $N_B/N_B+1$ bit encoding. The $N_B/N_B+1$ encoded bits are then combined with OAM bits and parity bits at the multiplexer to form FEC frames. In an embodiment, OAM bits that indicate a fault status (e.g., a low voltage condition or an open/short circuit condition) are received from the fault status logic 387 as indicated in FIG. 3A. Other information related to fault status can also be communicated via OAM words. The FEC frames are then provided to the encoder 386 for FEC encoding. For example, the FEC frames may be encoded using Reed-Solomon encoding. The FEC frames are then mapped from bits to symbols by the bits-to-symbols mapper 388 and then converted to analog signals that are transmitted on the link 306 by the TX-line driver (PMA) 389. The transmissions are received by the RX front-end (PMA) 390 of node B 304, which converts the analog signals to received symbols, and the received symbols are mapped to bits by the symbols-to-bits mapper 391. The bits are then decoded by the decoder 392. Once the FEC frames are passed through the decoder, the bits that make up an FEC frame are identified by the demultiplexer 393. For example, the bits of the FEC frames are identified as payload bits, OAM bits, or parity bits. The payload bits are then decoded by the $N_B/N_B+1$ decoder 394 and the decoded bits are passed to the XGMII 383, which can pass the bits to a higher layer application. In an embodiment, the OAM bits (e.g., in the form of an OAM word) are extracted from the FEC frames by the demultiplexer 393 and provided to the fault status logic 387 as indicated in FIG. 3A. As described herein, the OAM word may include an indication of status of various fault conditions. Other information related to fault status can also be communicated via OAM words. The fault status logic can then use the OAM bits in the OAM word to determine if any action should be taken, such as notifying a higher layer of the fault status or changing a setting of the PHY device. Using an OAM word inserted into an FEC frame that also carries payload data to communicate the fault status of network node (e.g., the PHY device) provides for an efficient way to communicate the fault status of network nodes in real-time (e.g., "on-the-fly").

Figure 3B:
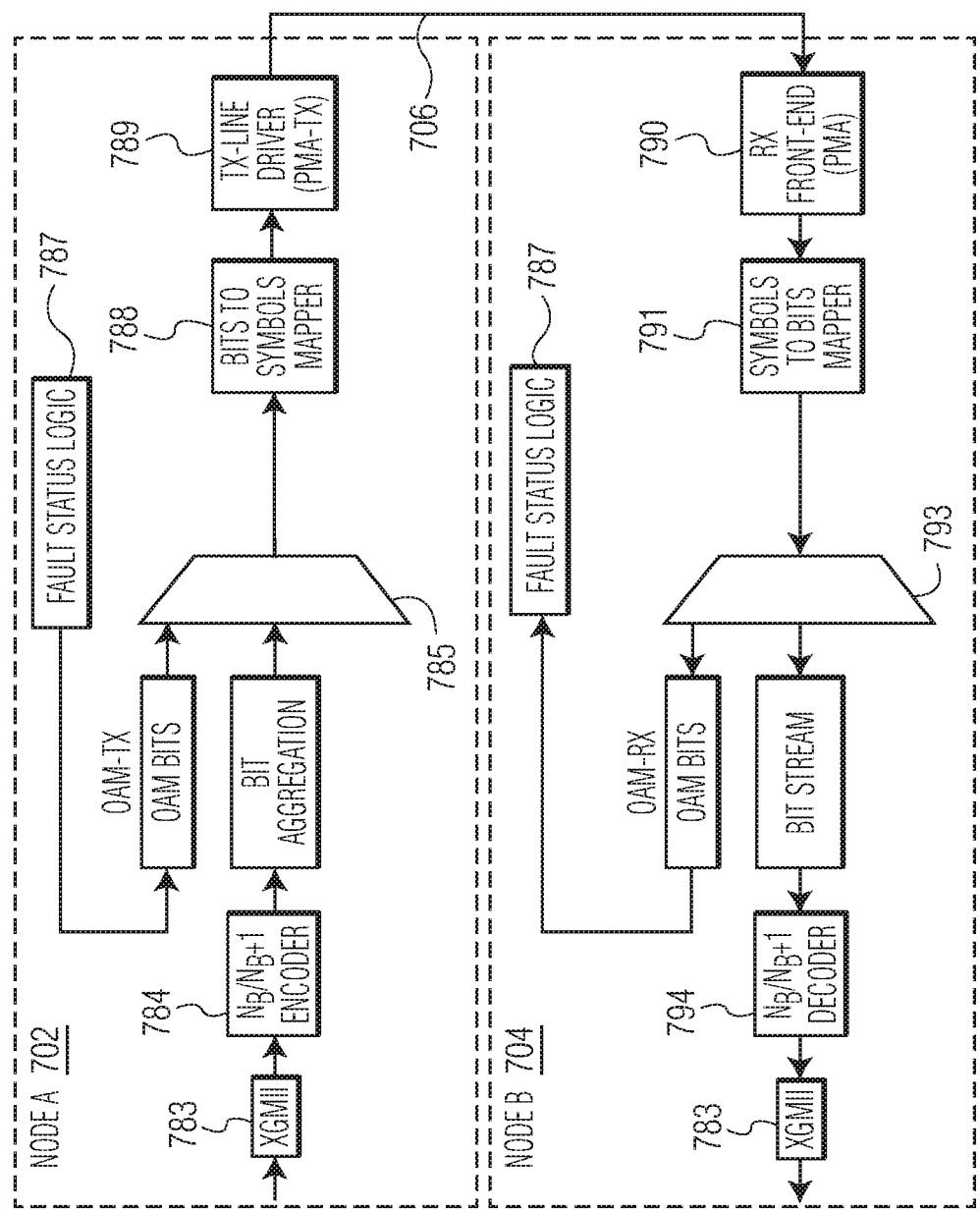
FIG. 3B illustrates the processing of a bit stream at the physical level between two nodes in a network.

In an embodiment, the nodes may not implement FEC on the bit streams that are communicated across the physical link. FIG. 3B illustrates a process for transmitting and receiving a bit stream at the physical layer between two nodes, node A 302 and node B 304, in a point-to-point network that utilizes, for example, Ethernet, in which FEC is not implemented. In the example of FIG. 3B, node A transmits frames on physical link 306 and node B receives the bit stream on the physical link. As depicted in FIG. 3B, node A includes a gigabit MII (XGMII) 383, an $N_B/N_B+1$ encoder 384 (wherein $N_B$ is the number of bits in a word), a multiplexer 385, fault status logic 387, a bits-to-symbols mapper 388, and a TX-line driver (PMA-TX) 389, and node B 304 includes an RX front-end (PMA-RX) 390, a symbols-to-bits mapper 391, a demultiplexer 393, fault status logic 387, an N/N+1 decoder 394, and a gigabit MII (XGMII) 383. Although the physical layer elements shown in FIG. 3B include an $N_B/N_B+1$ encoder 384 and an $N_B/N_B+1$ decoder 394, in other embodiments the $N_B/N_B+1$ encoder and decoder may use some other type of encoding/decoding or the $N_B/N_B+1$ encoder and decoder may be omitted.

In operation (described from transmission to reception), a bit stream is received at node A 302 (e.g., at a PHY chip) via the XGMII 383 and passed to the $N_B/N_B+1$ encoder 384 for $N_B/N_B+1$ bit encoding. The $N_B/N_B+1$ encoded bits are then combined with OAM bits to form the bit stream that will be transmitted across the physical link. In an embodiment, OAM bits that indicate a fault status (e.g., a low voltage condition or an open/short circuit condition) are received from the fault status logic 387 as indicated in FIG. 3B. Other information related to fault status can also be communicated via OAM words. The bit stream is then provided bits-to-symbol mapper 388 where the bits of the bit stream are mapped from bits to symbols and then converted to analog signals that are transmitted on the link 306 by the TX-line driver (PMA) 389. The transmissions are received by the RX front-end (PMA) 390 of node B 304, which converts the analog signals to received symbols, and the received symbols are mapped to bits by the symbols-to-bits mapper 391. The bits of the bit stream are then passed to the demultiplexer 393 where the OAM bits are extracted from the payload bits of the bit stream. The payload bits are then decoded by the $N_B/N_B+1$ decoder 394 and the decoded bits are passed to the XGMII 383, which can pass the bits to a higher layer application. The extracted OAM bits (e.g., in the form of an OAM word) are provided to the fault status logic 387 as indicated in FIG. 3B. Using an OAM word inserted into a bit stream that also carries payload data to communicate the fault status of network node (e.g., the PHY device) provides for an efficient way to communicate the fault status of network nodes in real-time (e.g., "on-the-fly").

Figure 4:
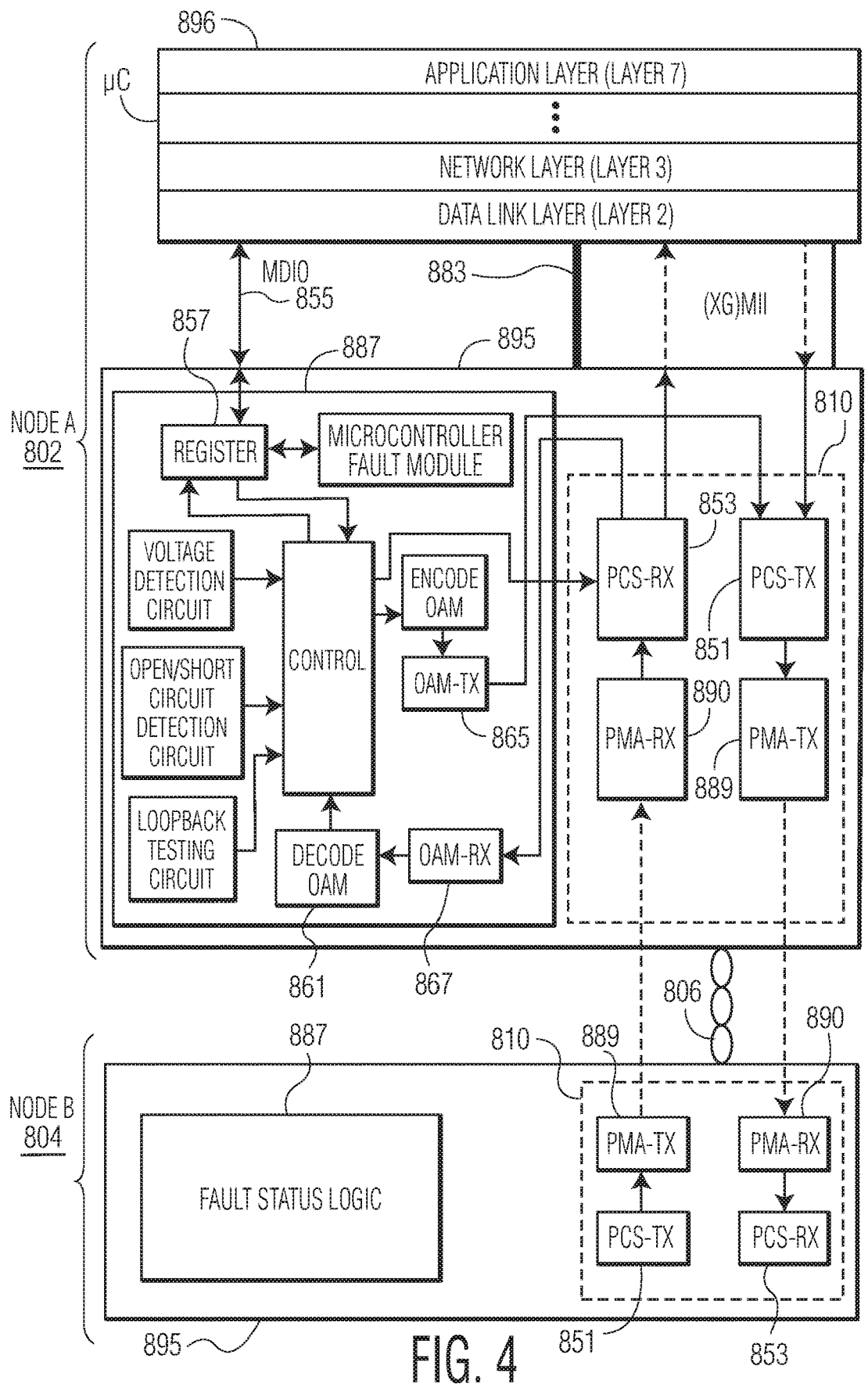
FIG. 4 depicts an example of components at the physical level of two nodes in a communications network that are connected by a link.

FIG. 4 depicts an example of components at the physical level of two nodes, node A 402 and node B 404, in a point-to-point communications network that are connected by a link 406. In the example of FIG. 4, the physical layers are embodied as integrated circuits 495 that incorporate physical layer functionality, referred to herein as "PHY chips" or "PHY devices." The PHY chips 495 may be components of the nodes A and B, respectively, and the nodes may include additional elements, such as elements of an electronic control unit (ECU) as is known in the field of in-vehicle networks. For example, ECUs may also include a microprocessor, a sensor, an actuator, etc. as is known in the field. FIG. 4 also depicts higher level layers of the node, e.g., the data link layer (layer 2, L2), the network layer (layer 3, L3), and the application layer (layer 7, L7), which may interact with the physical layer and which may be implemented at least in part by, for example, a microcontroller.

With reference to node A, 402, the PHY chip 495 includes a transceiver 410 that includes a physical coding sublayer transmitter (PCS-TX) 451, a physical medium attachment transmitter (PMA-TX) 489, a physical coding sublayer receiver (PCS-RX) 453, a physical medium attachment receiver (PMA-RX) 490, fault status logic 487, a MII 483 (e.g., XGMII), and an MDIO 455. In the embodiment of FIG. 4, the fault status logic 487 includes a register 430, control logic 432, an encode OAM module 434, an OAM-TX module 436, an OAM-RX module 438, a decode OAM module 440, and a microcontroller fault module 450. The PHY chip also includes a voltage detection circuit 452, an open/short circuit detection circuit 454, and a loopback testing circuit 456, which may be used to identify certain faults at the network node. Although not shown in FIG. 4, node B may include similar elements to node A, including, for example, the elements of the fault status logic 487. The physical medium attachment transmitter (PCS-TX) 451, the physical medium attachment transmitter (PMA-TX) 489, the physical coding sublayer receiver (PCS-RX) 453, and the physical medium attachment receiver (PMA-RX) 490 perform functions that include functions which are known, for example, in the field of Ethernet based in-vehicle networks. Although the example PHY device of FIG. 4 is described as having a microcontroller fault module, a voltage detection circuit 452, an open/short circuit detection circuit 454, and a loopback testing circuit 456 for fault status management, the PHY device may have only one of the fault detection components, or a combination of the components that does not include each one of the components. For example, an embodiment of the PHY device may include only the voltage detection circuit and the open/short circuit detection circuit.

In the embodiment of FIG. 4, the register 430 of the fault status logic 487 is a memory register that stores information that can be used to identify a fault status. For example, the register may store information that identifies a low voltage condition, information that identifies an open/short circuit condition, information that identifies a faulty microcontroller, and/or information that indicates the results of a loopback test. The information may be read from the register or written to the register by a higher layer. For example, a higher layer may write information related to the status of a microcontroller into the register and/or a higher layer may write information related to a result of a loopback test into the register.

In an embodiment, the encode OAM module 434 of the fault status logic 487 is configured to encode information received from the control logic 432 into OAM bits. For example, the encode OAM module is configured to encode an indication of a fault status into an OAM word according to OAM encoding rules. For example, an indication that a low voltage condition exists at the PHY device may be encoded into an 8-bit OAM word.

In an embodiment, the OAM-TX module 436 of the fault status logic 487 is configured to buffer the encoded OAM bits (e.g., as an OAM word) before the encoded OAM bits are embedded into the payload field of an FEC frame. For example, an OAM word is embedded into a stream of data that makes up the payload of an FEC frame. In an embodiment, the OAM-TX module includes a buffer for temporarily storing the OAM bits before the OAM bits are embedded into the payload field of an FEC frame.

In an embodiment, the OAM-RX module 438 of the fault status logic 487 is configured to buffer encoded OAM bits (e.g., as an encoded OAM word) that have been extracted from the payload field of an FEC frame. For example, an OAM word is extracted from a stream of data that makes up the payload. In an embodiment, the OAM-RX module includes a buffer for temporarily storing the extracted encoded OAM word.

In an embodiment, the decode OAM module 440 of the fault status logic 487 is configured to decode the encoded OAM word that is extracted from the payload field of the FEC frame and to pass the decoded information to the control logic 432. For example, the decode OAM module is configured to decode the OAM word to information that is understood by the control logic. For example, an 8-bit OAM word is decoded into information, which is understood by the control logic, to notify the receiving network node that a fault was identified at the transmitting network node. In an embodiment, the encode OAM module and the decode OAM module encode and decode according to a complementary set of encoding and decoding rules.

In an embodiment, the control logic 432 of each node controls the operation of the fault status logic 487. For example, the control logic enables a node to share its fault status information with other nodes in the network. In an example, the two nodes are able to share fault status information so that the nodes can take a desired action.

In an embodiment, the voltage detection circuit 452 is a circuit in the PHY chip 495 that is able to detect a voltage condition, e.g., a low voltage condition or a high voltage condition in the PHY chip. Voltage detection circuits, including high voltage detection circuits and low voltage detection circuits are known in the field. In an embodiment, the voltage detection circuit provides an output to the fault status logic. In one embodiment, the output of the voltage detection circuit indicates that the voltage is below a desired voltage, e.g., a low voltage condition. An example implementation of a voltage detection circuit is described with reference to FIG. 5.

In an embodiment, the open/short circuit detection circuit 454 is a circuit in the PHY chip 495 that is able to detect an open circuit or short circuit condition in the PHY chip. Open circuit or short circuit detection circuits are known in the field. In an embodiment, the open/short circuit detection circuit provides an output to the fault status logic. In one embodiment, the output of the open/short circuit detection circuit indicates that an open or short circuit exists in the PHY chip. For example, the output of the open/short circuit detection circuit indicates that an undesirable open or short circuit exists in the PHY chip. In an embodiment, the open/short circuit detection circuit may be configured to detect an open/short circuit by measuring transmission line parameters such as the line impedance, the reflected signal strength, and/or the transmitted signal strength. An example implementation of a voltage detection circuit is described with reference to FIG. 6.

In an embodiment, the microcontroller fault module 450 is a circuit and/or logic in the PHY chip 495 that provides an indication that a microcontroller is faulty. In an embodiment, the microcontroller fault module may be a register that gets set by a higher layer in the network node when a fault condition in the microcontroller is identified. In another embodiment, the microcontroller fault module includes logic circuits to determine, at the physical layer, that there is some fault associated with the microcontroller. For example, the faulty microcontroller may be configured to evaluate the bits of data that are provided to the transceiver through the (XG)MII 483 and/or evaluate the bits of data that are decoded on the communications link 406 to identify a fault associated with the microcontroller. In one embodiment, the output of the microcontroller fault module indicates that the microcontroller of the network node has some fault condition. An example implementation of the microcontroller fault module is described with reference to FIG. 7.

In an embodiment, the loopback testing circuit 456 is a circuit in the PHY chip 495 that provides circuitry to enable loopback testing of the circuit at the PHY layer. For example, the loopback testing circuitry may include splitters, combiners, demultiplexers, and/or multiplexers that enable signals to be looped back within the PHY chip. Loopback testing circuitry for PHY chip is known in the field. In an embodiment, loopback testing is controlled at a higher layer than the physical layer. For example, loopback testing is controlled at layer 2 or at the application layer. In an embodiment, the result of loopback testing is provided to the register 430 of the fault status logic 487 from a higher layer through the MDIO 455. Loopback testing of the physical layer components may involve internal loopback testing, external loopback testing, and/or remote loopback testing. Techniques for implementing loopback testing of physical layer components such as internal loopback testing, external loopback testing, and/or remote loopback testing are known in the field. Example implementations of loopback testing are described with reference to FIGS. 8A-8C and 9.

In an example of a transmission operation, the control logic 432 of the fault status logic 487 identifies information about fault status. For example, the control logic obtains information about a fault status from at least one of the register 430, the microcontroller fault module 450, the voltage detection circuit 452, the open/short circuit detection circuit 454, or the loopback testing circuit 456. The control logic is configured to evaluate the information to determine if information about a fault status should be shared with another node. The desired fault status information that is determined by the control logic can be provided to the encode OAM module 434, wherein the desired fault status information is encoded into OAM bits, e.g., of an OAM word. The OAM bits are then provided to the OAM-TX module 436, which may include buffering memory and/or logic to provide the OAM bits (e.g., as an OAM word) to the transceiver 410 for insertion into an FEC frame. The FEC frames, including at least one FEC frame with the encoded OAM bits, are transmitted on the link 406 as analog signals by the PMA-TX 489. In an example, with respect to a low voltage condition, a fault status may be low voltage condition=YES or low voltage condition=NO. In other embodiment, a fault status may be simple an indication of "low voltage condition." In an embodiment, a fault status is shared as fault code, which is generated by the control logic, then encoded into a few OAM bits, and then decoded back to a fault code that can be understood by the control logic. The control logic can also set a value in the register to indicate a fault status. The value can be read by a higher layer through the MDIO 455.

In an example of a receive operation, the PMA-RX 490 of node A 402 receives electrical signals on the link 406, decodes the signals into symbols, and provides the symbols to the PCS-RX 453. The PCS-RX maps the symbols to a bit stream and demultiplexes the OAM bits and the payload bits as described with reference to FIGS. 3A and 3B. An OAM word extracted from an FEC frame by the PCS-RX 453 is provided to the OAM-RX module 438, e.g., for buffering. The OAM word is then decoded by the decode OAM module 440 and information about a fault status is provided to the control logic 432 in a format that can be understood by the control logic. In response to the information about a fault status, the control logic may write information to the register 430 and/or may take some other action. For example, a node may chose to operate in a fail safe mode (e.g., a low data rate mode) or a node may notify other nodes in the network of the fault status.

Figure 5:
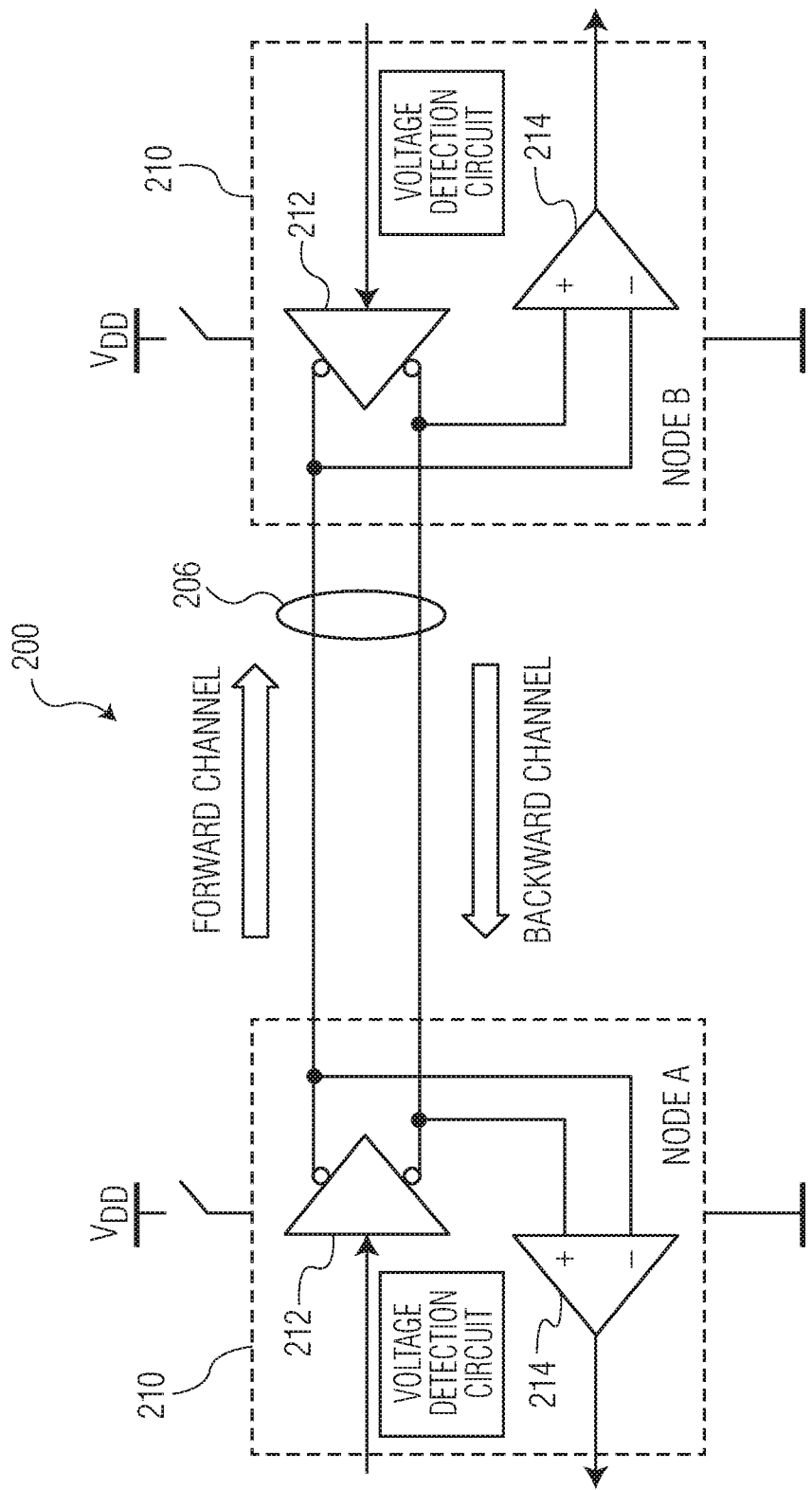
FIG. 5 depicts an embodiment of a point-to-point communications network that includes an expanded view of the transceivers shown in FIG. 1.

FIG. 5 depicts an embodiment of a point-to-point communications network 500 that includes an expanded view of the transceivers 510 shown in FIG. 1 in which both transceivers include a voltage detection circuit 520. As shown in FIG. 5, the transceivers 510 include the transmitters 512 and the receivers 514, which are connected to each other by the communications medium 506, e.g., twisted pair wires. Although not shown in FIG. 5, the receivers 514 may each include a DSP that is configured to perform digital processing functions such as, for example, equalizer functions, echo cancellation functions, automatic gain control (AGC) functions, clock data recovery (CDR) functions, baseline wander (BLW) functions, and/or data recovery functions. In the embodiment of FIG. 5, the voltage detection circuit is part of the PHY device and is connected to monitor a voltage condition on the PHY device. For example, the voltage detection circuit is configured to monitor for a low voltage condition in a circuit of the transceiver. The voltage detection circuit is also configured to provide an output to the fault status logic, for example, an output that indicates whether a monitored voltage has dropped below a voltage threshold (e.g., a low voltage condition) or whether a monitored voltage has risen above a voltage threshold (e.g., a high voltage condition).

Figure 6:
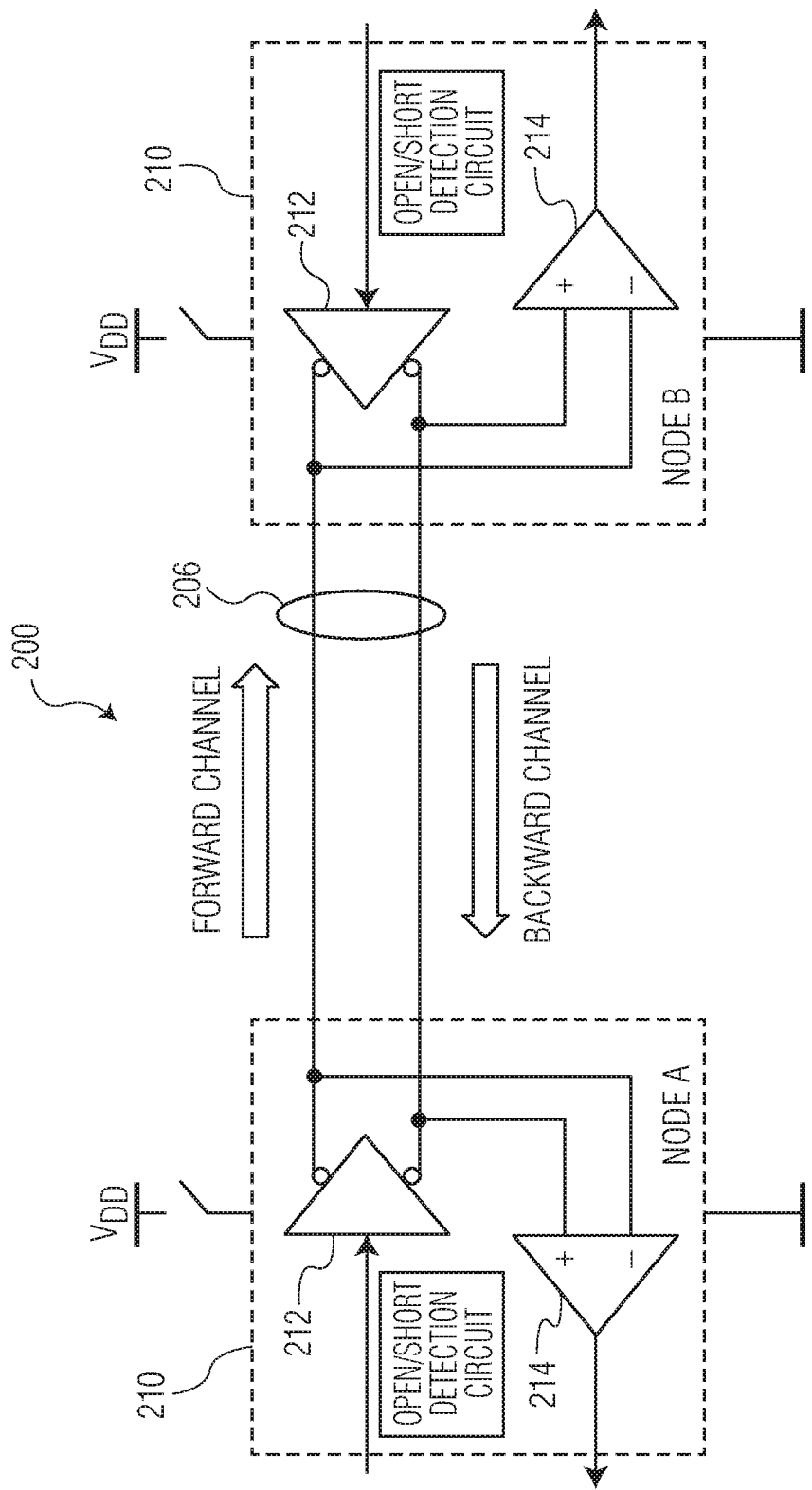
FIG. 6 depicts an embodiment of a point-to-point communications network that includes an expanded view of the transceivers shown in FIG. 1.

FIG. 6 depicts an embodiment of a point-to-point communications network 600 that includes an expanded view of the transceivers 610 shown in FIG. 1 in which both transceivers include an open/short circuit detection circuit 622. As shown in FIG. 6, the transceivers 610 include the transmitters 612 and the receivers 614, which are connected to each other by the communications medium 606, e.g., twisted pair wires. Although not shown in FIG. 6, the receivers 614 each include a DSP that is configured to perform digital processing functions such as, for example, equalizer functions, echo cancellation functions, automatic gain control (AGC) functions, clock data recovery (CDR) functions, baseline wander (BLW) functions, and/or data recovery functions. In the embodiment of FIG. 6, the open/short circuit detection circuit is part of the PHY device and is connected to detect an open/short circuit condition on the PHY device. For example, the open/short circuit detection circuit is configured to monitor circuits in the PHY device for an undesirable open/short circuit condition on the PHY device. The open/short circuit detection circuit is also configured to provide an output to the fault status logic, for example, an output that indicates whether an open/short circuit condition exists on the PHY device.

Figure 7:
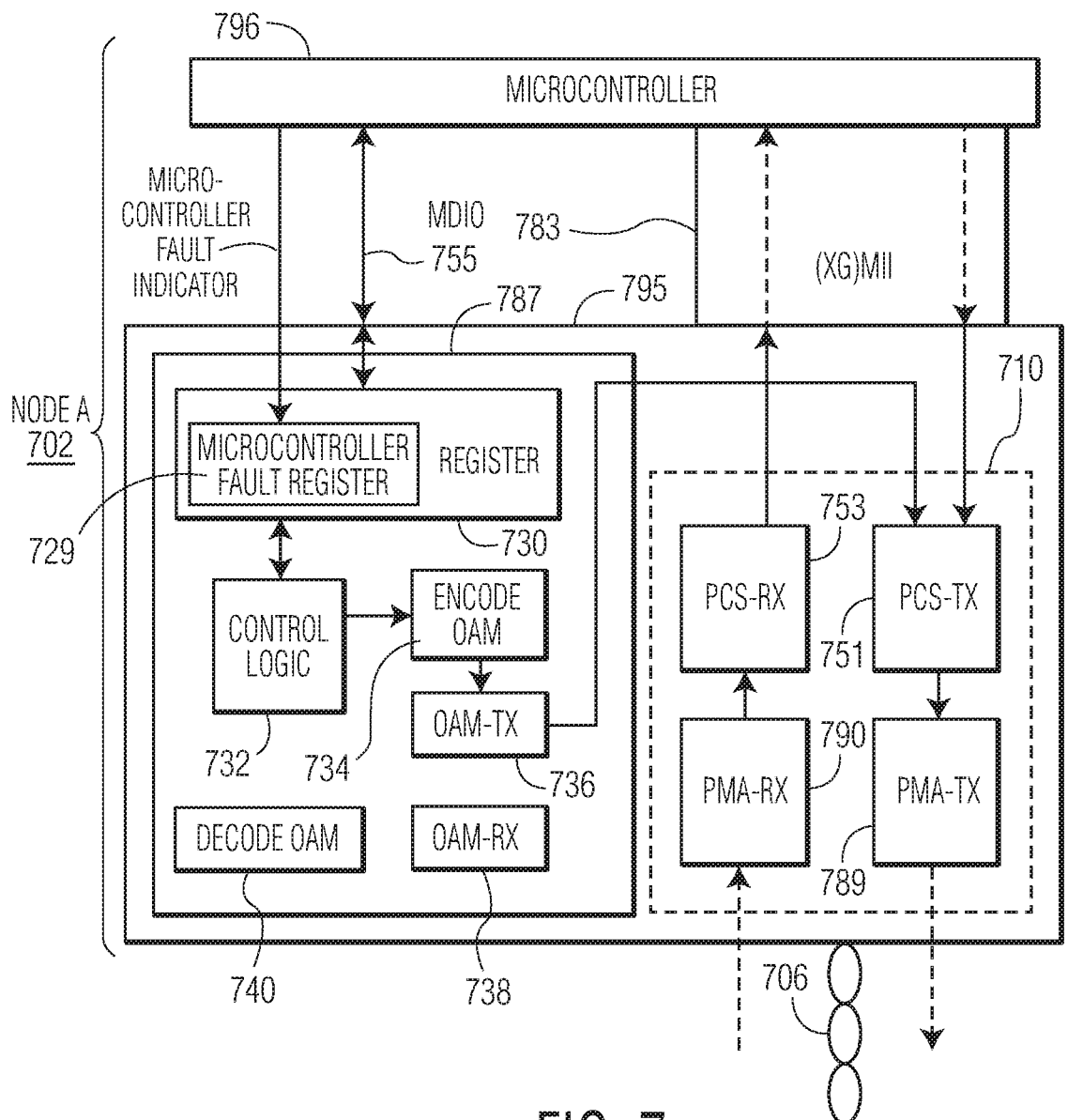
FIG. 7 illustrates identifying a microcontroller fault at the physical level of a network node.

FIG. 7 illustrates an example process of sharing a fault status related to a faulty microcontroller. The example of FIG. 7 depicts node A 702 as including a PHY chip 795, which is similar to the PHY chip 495 described with reference to FIG. 4, and a microcontroller 796. In the example of FIG. 7, the microcontroller writes to a microcontroller fault register 729 of the register 730 an indication that the microcontroller is exhibiting some fault, e.g., a faulty microcontroller. The microcontroller may notify the PHY chip 795 of various types of faults, including for example, an electrical fault (e.g., an under voltage condition) or a fault which results in a data pattern that does not make sense to the microcontroller. The microcontroller may notify the PHY device of other types of faults such as faults that result in an error of a state machine or a fault in the input/output capability of the microcontroller. Once the register 729 is set, the control logic 732 reads the register value and determines that the register value corresponds to a microcontroller fault status that should be shared with at least one other network node. The desired fault status information is then provided to the encode OAM module 734 by the control logic and the encode OAM module encodes the information into OAM bits, e.g., into an OAM word. The OAM bits are then provided to the OAM-TX module 736, which may include buffering memory and/or logic to provide the OAM bits (e.g., as an OAM word) to the transceiver 710 for insertion into an FEC frame. The FEC frames, including at least one FEC frame with the encoded OAM bits, are transmitted on the link 706 as analog signals by the PMA-TX 789.

Figure 8A:
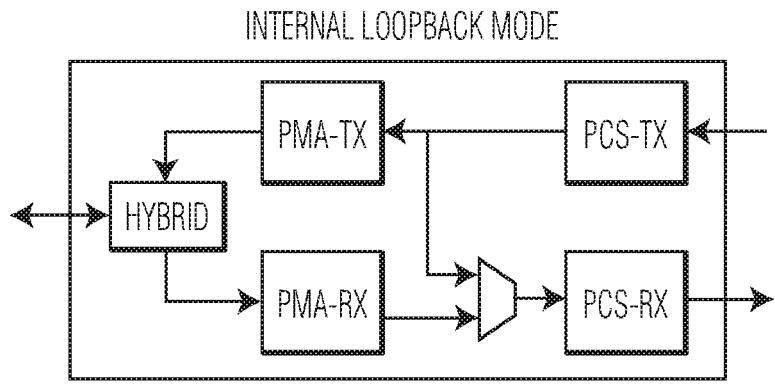
FIG. 8A illustrates an internal loopback testing operation for testing a fault status of a network node.
Figure 8B:
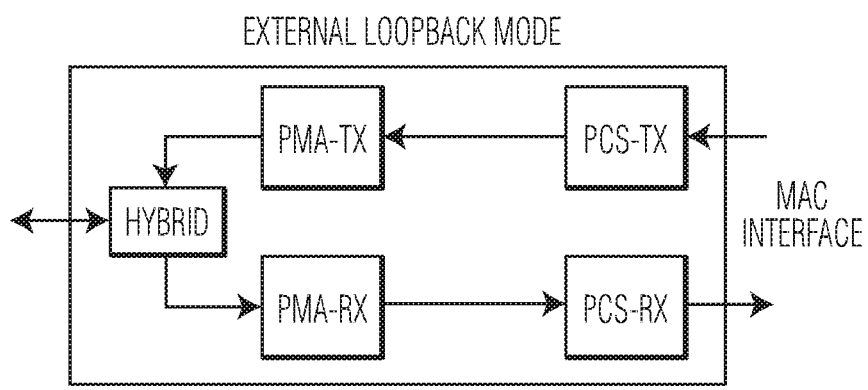
FIG. 8B illustrates an external loopback testing operation for testing a fault status of a network node.
Figure 8C:
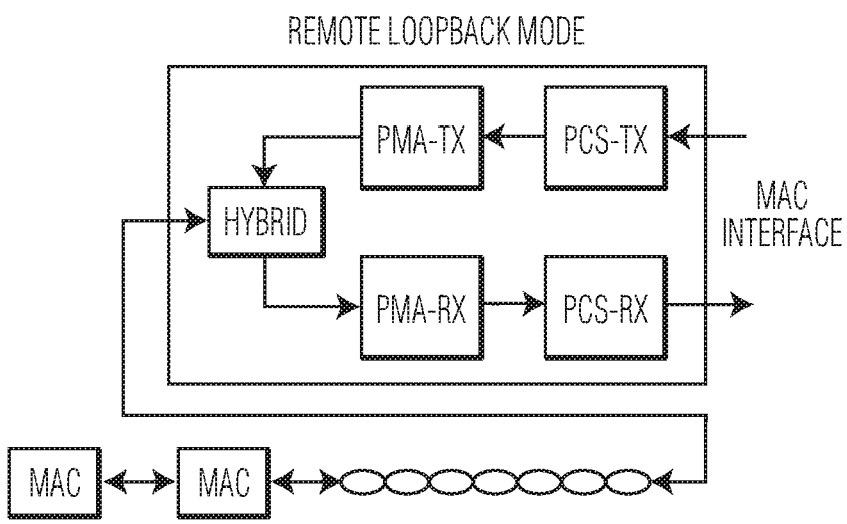
FIG. 8C illustrates a remote loopback testing operation for testing a fault status of a network node.

In an embodiment, a network node may implement loopback testing to determine if there is a fault at the network node and/or to determine if there is a fault in the physical medium (e.g., the twisted pair wire and or connectors that connect the wire to the node) that connects the network node to another network node. For example, internal loopback testing and external loopback testing are known techniques for testing physical layer components of a PHY device/PHY chip and remote loopback testing is a known technique for testing the physical medium (e.g., the twisted pair wire and or connectors that connect the wire to the node) that connects the network node to another network node. FIGS. 8A-8C illustrate examples of internal loopback testing, external loopback testing, and remote loopback testing, respectively, which can be used at a network node to identify a fault status.

FIG. 8A illustrates an internal loopback testing operation for testing a fault status of a network node. As shown in FIG. 8A, the node 802 includes a PCS-TX 851, a PMA-TX 889, a hybrid 888 (e.g., a device to mix and separate signals), a PMA-RX 890, a multiplexer 891, and a PCS-RX 853. The internal loopback testing involves a loopback path 870 that passes through the PCS-TX, the multiplexer, and the PCS-RX.

FIG. 8B illustrates an external loopback testing operation for testing a fault status of a network node. As shown in FIG. 8B, the node 802 includes a PCS-TX 851, a PMA-TX 889, a hybrid 888 (e.g., a device to mix and separate signals), a PMA-RX 890, and a PCS-RX 853. The external loopback testing involves a loopback path 872 that passes through the PCS-TX, the PMA-TX, the hybrid, the PMA-RX, and the PCS-RX.

FIG. 8C illustrates a remote loopback testing operation for testing a fault status of a network node. As shown in FIG. 8C, the node 802 includes a PCS-TX 851, a PMA-TX 889, a hybrid 888 (e.g., a device to mix and separate signals), a PMA-RX 890, and a PCS-RX 853. The remote loopback testing involves a loopback path 874 that passes through the PCS-TX, the PMA-TX, the hybrid, the physical medium 806, a PHY device and a MAC device at a remote node, the PMA-RX, and the PCS-RX.

Figure 9:
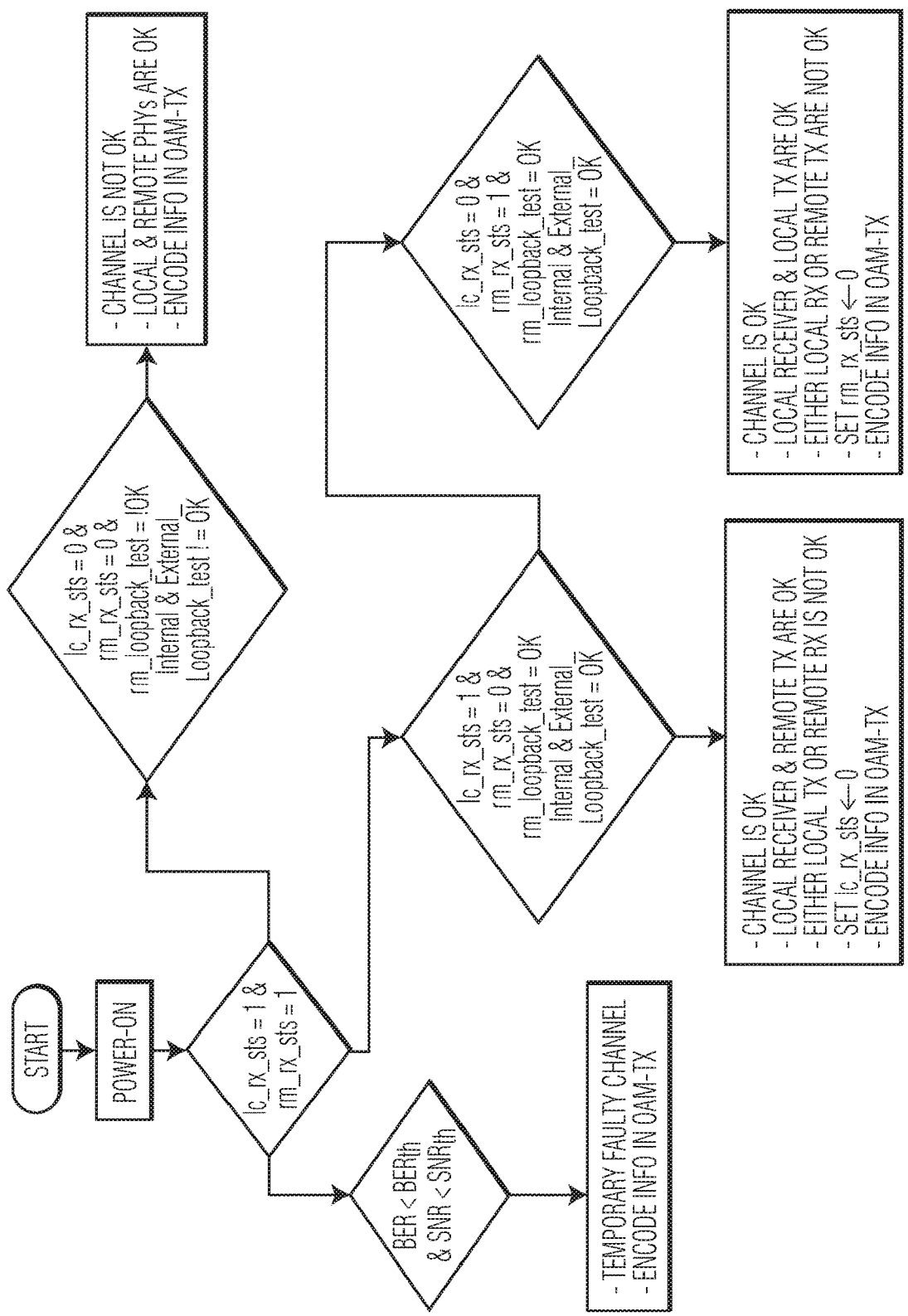
FIG. 9 is a logic flow diagram of fault status logic.

FIG. 9 depicts logic that may be implemented at a network node to identify a fault status in response to information that may include loopback testing, including internal loopback testing, external loopback testing, and/or remote loopback testing. After starting, at block 902, the network node is powered on. At decision point 904, the status of register values for the local and remote receivers (lc_rx_sts and lc_rx_sts) are determined. In the example of FIG. 9, a register value of "1" indicates that the receiver is healthy and a register value of "0" indicates that the receiver is not healthy. At decision point 906, if the BER is less than a BER threshold and the signal-to-noise ratio (SNR) is less than an SNR threshold, then the node is considered healthy, block 908. However, if the BER is not less than a BER threshold and the signal-to-noise ratio (SNR) is not less than an SNR threshold, then at block 910 it is determined that there is temporary faulty channel and OAM bits are encoded accordingly to indicate a fault status.

If at decision point 912, the status of register values for the local and remote receivers (lc_rx_sts and rm_rx_sts) are lc_rx_sts=0 and rm_rx_sts=0, and a remote loopback test is OK (rm_loopback_test=!OK) and internal and external loopback tests are OK (Internal & External_Loopback_test!=OK), then at block 914, the channel is not ok, the local and remote PHYs are OK, and OAM bits are encoded accordingly to indicate a fault status.

If at decision point 916, the status of register values for the local and remote receivers (lc_rx_sts and rm_rx_sts) are lc_rx_sts=1 and rm_rx_sts=0, and a remote loopback test is OK (rm_loopback_test=OK) and internal and external loopback tests are OK (Internal & External_Loopback_test=OK), then at block 918, the channel is ok, the local receiver and remote transmitter are ok, either the local transmitter or remote receiver is not ok, the register, lc_rx_sts is set to "0," and OAM bits are encoded accordingly to indicate a fault status.

If at decision point 920, the status of register values for the local and remote receivers (lc_rx_sts and rm_rx_sts) are lc_rx_sts=0 and rm_rx_sts=1, and a remote loopback test is OK (rm_loopback_test=OK) and internal and external loopback tests are OK (Internal & External_Loopback_test=OK), then at block 922, the channel is ok, the remote receiver and local transmitter are ok, either the local receiver or remote receiver is not ok, the register, rm_rx_sts is set to "0," and OAM bits are encoded accordingly to indicate a fault status.

As described above, the desired error management mode can be determined at, for example, node A and provided to node B. An example of providing error management mode information is now described with reference to FIGS. 4, 10A, and 10B. In particular, an example of a transmission operation to provide error management mode information is described with reference to FIGS. 4 and 10A and an example of a receive operation to share information is described with reference to FIGS. 4 and 10B. The examples of FIGS. 10A and 10B illustrate PDUs, e.g., Ethernet PDUs, and the OAM words are embedded into FEC frames (see FIG. 2A) that correspond to data in the payload field of the PDUs.

Figure 10A:
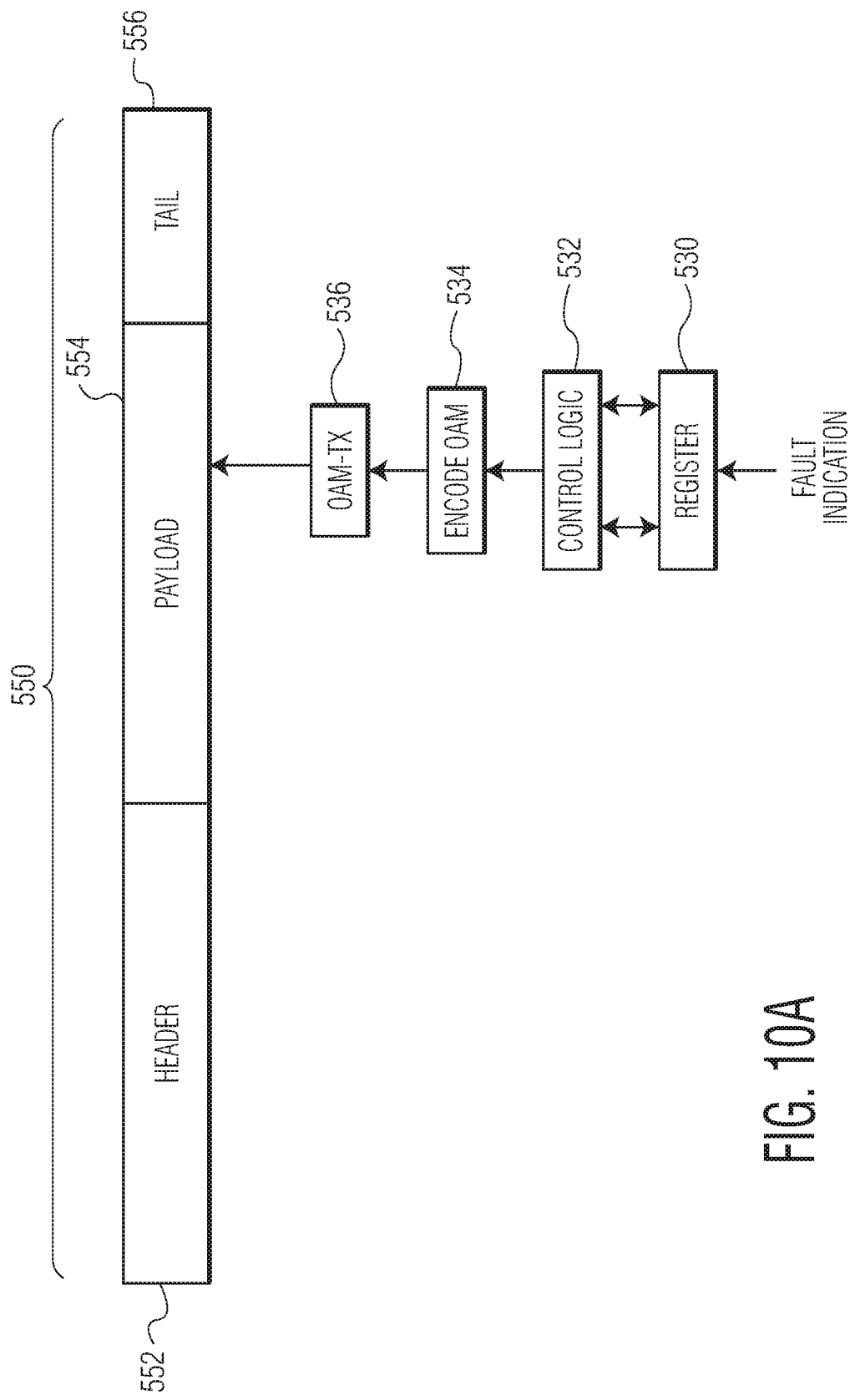
FIG. 10A illustrates an example of a transmission operation to share information between two nodes.

With reference to FIG. 10A, a PDU 1050 includes a header field 1052, a payload field 1054, and a tail field 1056. In the example of FIGS. 4, 10A, and 10B, the PDU is transmitted from node A to node B. FIG. 10A illustrates a process for embedding an indication of a fault status (fault indication) into the payload field of PDUs, e.g., information about a fault condition of the network node. As illustrated in FIG. 10A, the control logic 1032 may receive an indication of a fault status directly or via the register 1030. The control logic then determines the fault status information that is to be sent to the other node, e.g., to node A, encodes the information into an OAM word (or OAM words) at the encode OAM module 1034, and then buffers the OAM word at the OAM-TX module 1036 before the OAM bits are embedded into the payload field 1054 of the PDU. In an embodiment, the PDU is an Ethernet PDU and the OAM word is embedded into an FEC frame (see FIG. 2A), which carries at least a portion of the bits that form the payload field of the PDU. The PDU is then transmitted across the communications medium to the other node, e.g., to node A.

Figure 10B:
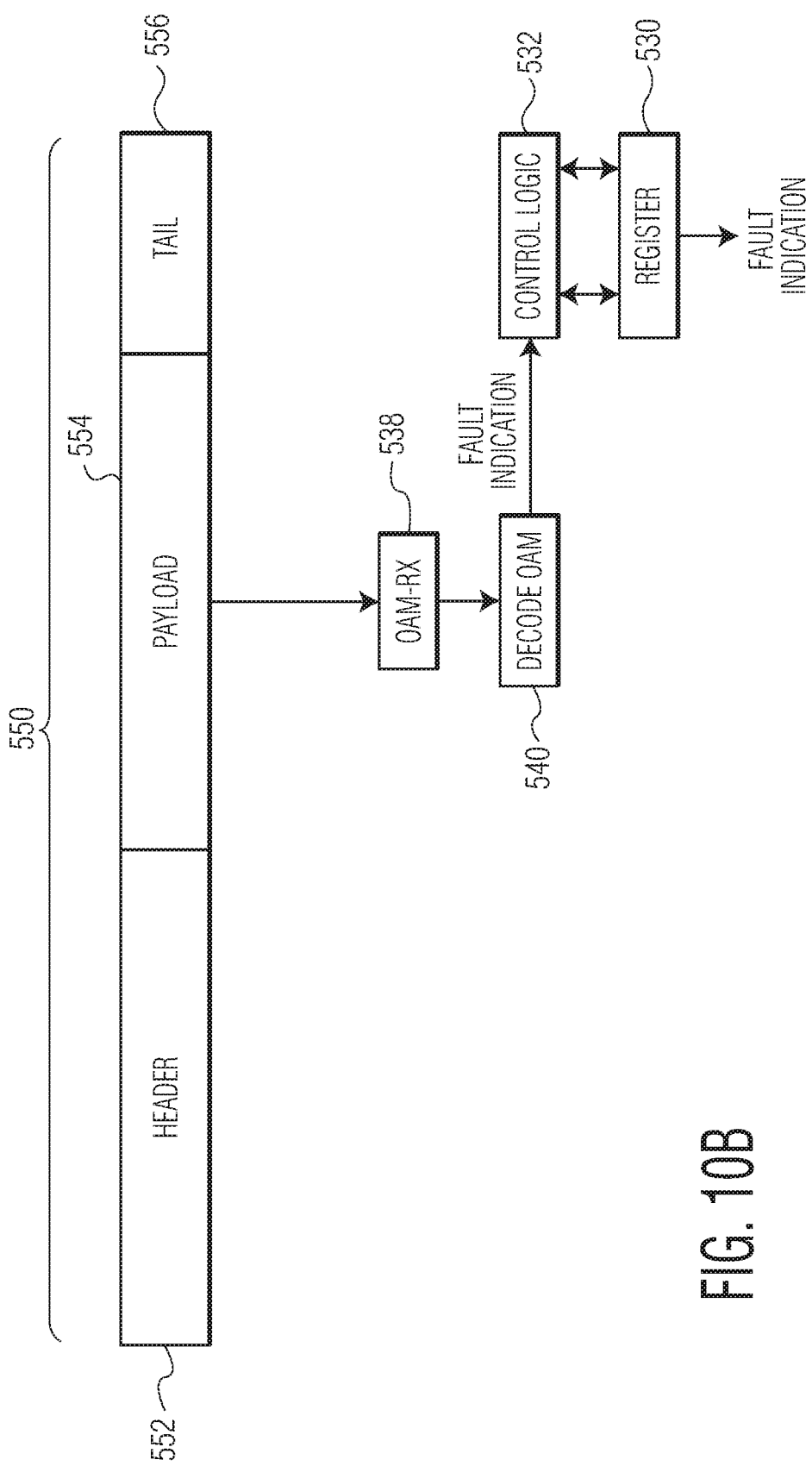
FIG. 10B illustrates an example of a receive operation to share information between two nodes.

With reference to FIG. 10B, the PDU 1050 transmitted from node A across the communications medium is received at node B. As illustrated in FIG. 10B, fault status information, which is carried in OAM bits, is extracted from the payload field 1054 of the PDU 1050. For example, the OAM bits are extracted from an FEC frame (see FIG. 2A), which carries a portion of the bits that form the payload field of the PDU, e.g., the Ethernet PDU. The extracted OAM bits are provided to the OAM-RX module 1038 for buffering and then decoded by the decode OAM module 1040 into an indication of a fault status that can be understood by the control logic 1032. The control logic may use the indication of a fault status to, for example, set a register 1030.

As described above, fault status information can be shared with other physical layer devices in a communications network. Various techniques for sharing physical layer fault status information and for using the shared fault status information to determine a fault status of the communications network are described below.

Figure 11:
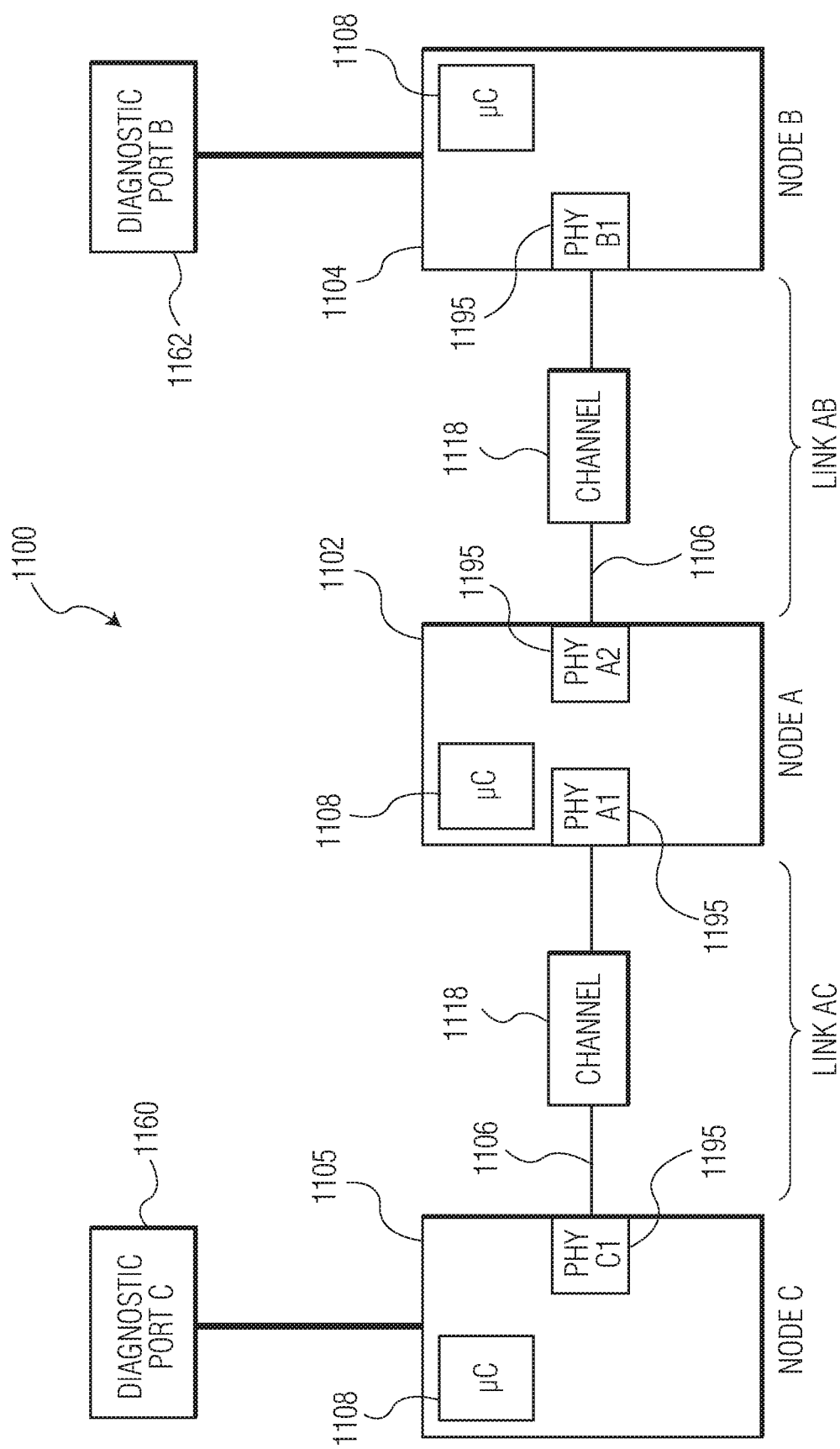
FIG. 11 depicts a communications network that includes three network nodes and two diagnostic ports.

FIG. 11 depicts a communications network 1100 that includes three network nodes 1102, 1104, and 1105 and two diagnostic ports 1160 and 1162. The network nodes include microcontrollers and transceivers as described above with reference to FIGS. 1-10B. As shown in FIG. 11, node A 1102 is connected to node B 1104 via a physical link 1106, such as a cable or wire, referred to as a link AB. In the example of FIG. 11, node A includes a microcontroller 1108 and a physical layer device 1195 (referred to herein as a PHY chip or a PHY device), identified as PHY chip A2, and node B includes a microcontroller 1108 and a physical layer device 1195, identified as PHY chip B1, and the link AB is connected between PHY chip A2 of node A and PHY chip B1 of node B. Likewise, node A is connected to node C 1105 via a physical link, such as a cable or wire, referred to as a link AC. In the example of FIG. 11, node A includes a PHY chip 1195, identified as PHY chip A1, and node C includes a microcontroller 1108 and a physical layer device 1195, identified as PHY chip C1, and the link AC is connected between PHY chip A1 of node A and PHY chip C1 of node C. In the communications network of FIG. 11, data may be communicated across the links 1106 in channels 1118.

In an embodiment, the two diagnostic ports, diagnostic port B 1160 and diagnostic port C 1162, are elements in the communications network 1100 that are configured to determine a fault status of the communications network in response to fault status information received at the diagnostic ports from one or more of the network nodes. As is described below, a diagnostic port can use fault information that is generated based on the register values in the registers of the physical layer devices (e.g., the PHY chips) to determine a fault status of the communications network. For example, the diagnostic ports may be able to determine that certain nodes in the network are unreachable based on the fault information that is derived from the register values in the registers of the PHY chips. In an embodiment, the diagnostic ports obtain information from the corresponding node through a serial interface, such as a Controller Area Network (CAN) interface, a FlexRay interface, or an Ethernet interface. In an embodiment, the diagnostic port may include a microprocessor circuit such as a microcontroller that executes computer readable instructions to implement network diagnostic functions. In an embodiment, the diagnostic ports are physical standard interfaces that facilitate access to diagnostic registers for read/write operations from or to the registers at the corresponding node through the serial interface. In an embodiment, an application that executes in a higher layer of a node (e.g., node A, B, and/or C) may be configured to determine that certain nodes in the network are unreachable based on the fault information that is derived from the register values in the registers of the PHY chips. For example, an application that executes at the application layer (layer 7) as described above with reference to FIG. 4 is configured to determine that certain nodes in the network are unreachable based on the fault information that is derived from the register values in the registers of the PHY chips.

Different scenarios of sharing fault status information and determining a fault status of a communications network are described below with reference to FIGS. 12A-14B.

Figure 12A:
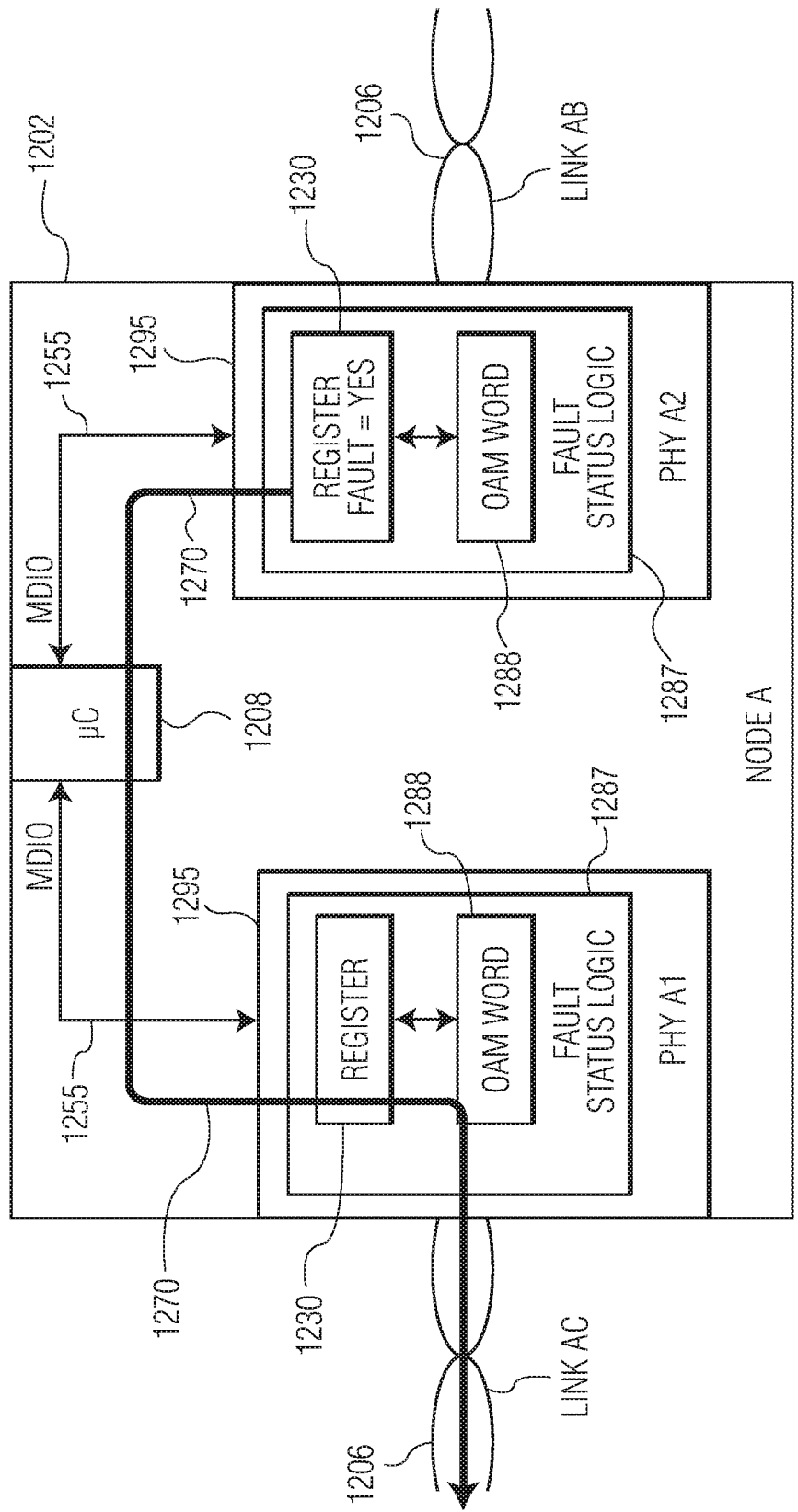
FIGS. 12A and 12B illustrate a scenario in which a register value is stored in the register of PHY chip A2 of node A that indicates a fault in the PHY chip or a fault in the link 1206 (e.g., link AB) that is connected to the PHY chip.
Figure 12B:
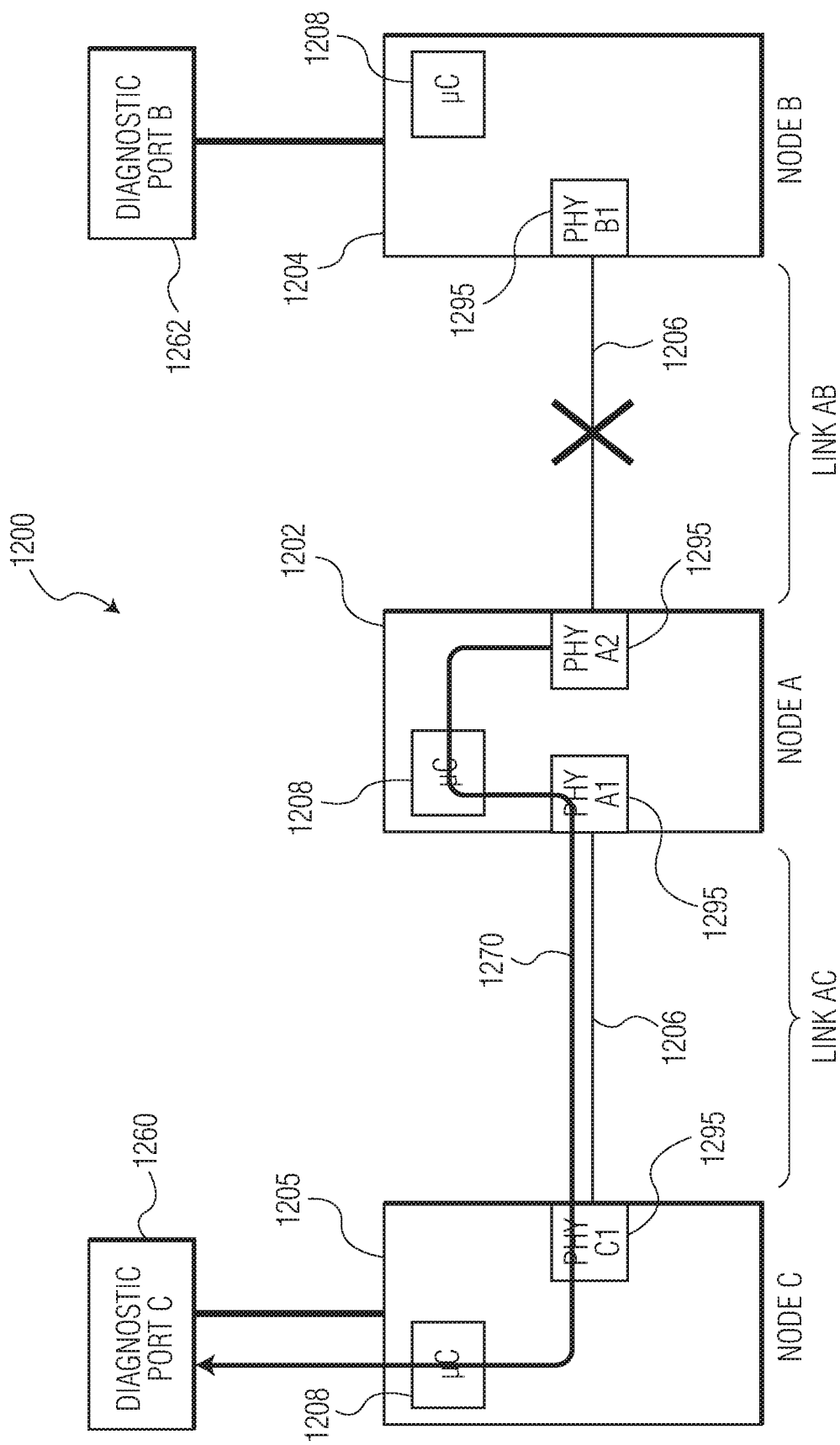

FIGS. 12A and 12B illustrate a scenario in which a register value is stored in the register of PHY chip A2 of node A that indicates a fault in the PHY chip or a fault in the link 1206 (e.g., link AB) that is connected to the PHY chip. For example, the fault may be a fault at the PHY chip, such as a low voltage condition or an open/short circuit condition as described above with reference to FIGS. 4-6 or the fault may be a fault detected via loop testing (e.g., internal, external, and/or remote loop testing) as described above with reference to FIGS. 8A-9. With reference to FIG. 12A, the register 1230 stores a register value (e.g., Fault=YES) that indicates that there is a fault condition at PHY chip A2 1295 that renders link AB inoperable. The register value is read by the microcontroller 1208 (e.g., via MDIO 1255) and provided, via the microcontroller, to the register 1230 of PHY chip A1 1295 of node A 1202. In an embodiment, the microcontroller is configured to read fault status information from the register and to pass the fault status information on to the other PHY chip of the node. As described above, the fault status logic 1287 of PHY chip A1 can then generate a fault code based on the register value stored in its register and embed the fault code as bits of an OAM word 1288 into a bit stream as described above. The OAM word, which includes the fault code, is then transmitted from PHY chip A1 of node A onto link AC. The sharing of fault status information from the register of PHY chip A2, through the microcontroller, through PHY chip A1, and on to link AC is illustrated by the continuous arrow 1270.

FIG. 12B illustrates the sharing of fault information from node A 1202 in the communications network 1200 to diagnostic port C 1260 via link AC. In particular, as illustrated by arrow 1270, the fault information is shared from the PHY chip A2 1295 of node A, e.g., from the register of PHY chip A2, through the microcontroller 1208 of node A, through PHY chip A1 of node A, through link AC, through PHY chip C1 of node C 1205, and then through the microcontroller of node C to diagnostic port C 1260. In an embodiment, the fault information is stored in corresponding registers of the PHY chips as register values that are indicative of the particular fault and then encoded into OAM bits and decoded from OAM bits by the fault status logic as described above. In an embodiment, diagnostic port C receives fault status information indicating that there is a fault associated with link AB. In an embodiment, the fault status information may indicate specific details of the particular fault, e.g., a low voltage condition at PHY chip A2, an open/short circuit condition at PHY chip A2, and/or a loopback fault associated with PHY chip A2, e.g., an internal, external, and/or remote loopback error. Diagnostic port C then uses the fault status information to determine a fault status of the communications network. For example, diagnostic port C can determine from the received fault status information that node B is unreachable from node C and that node B is unreachable from node A as indicated by the "X" on link AB.

Figure 13A:
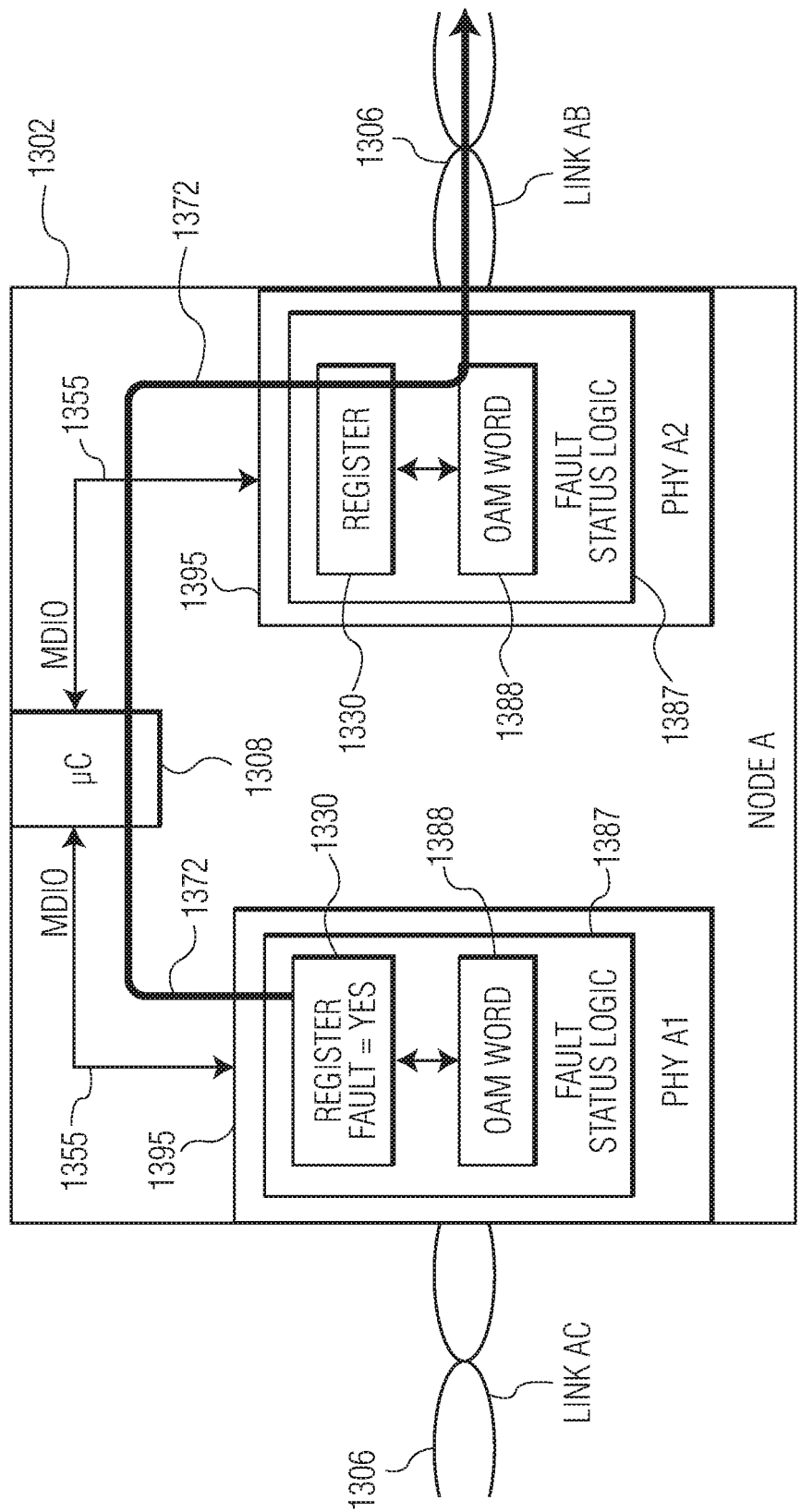
FIGS. 13A and 13B illustrate a scenario in which a register value is stored in the register of PHY chip A1 of node A that indicates a fault in the PHY chip or a fault in the link (e.g., link AC) that is connected to the PHY chip.
Figure 13B:
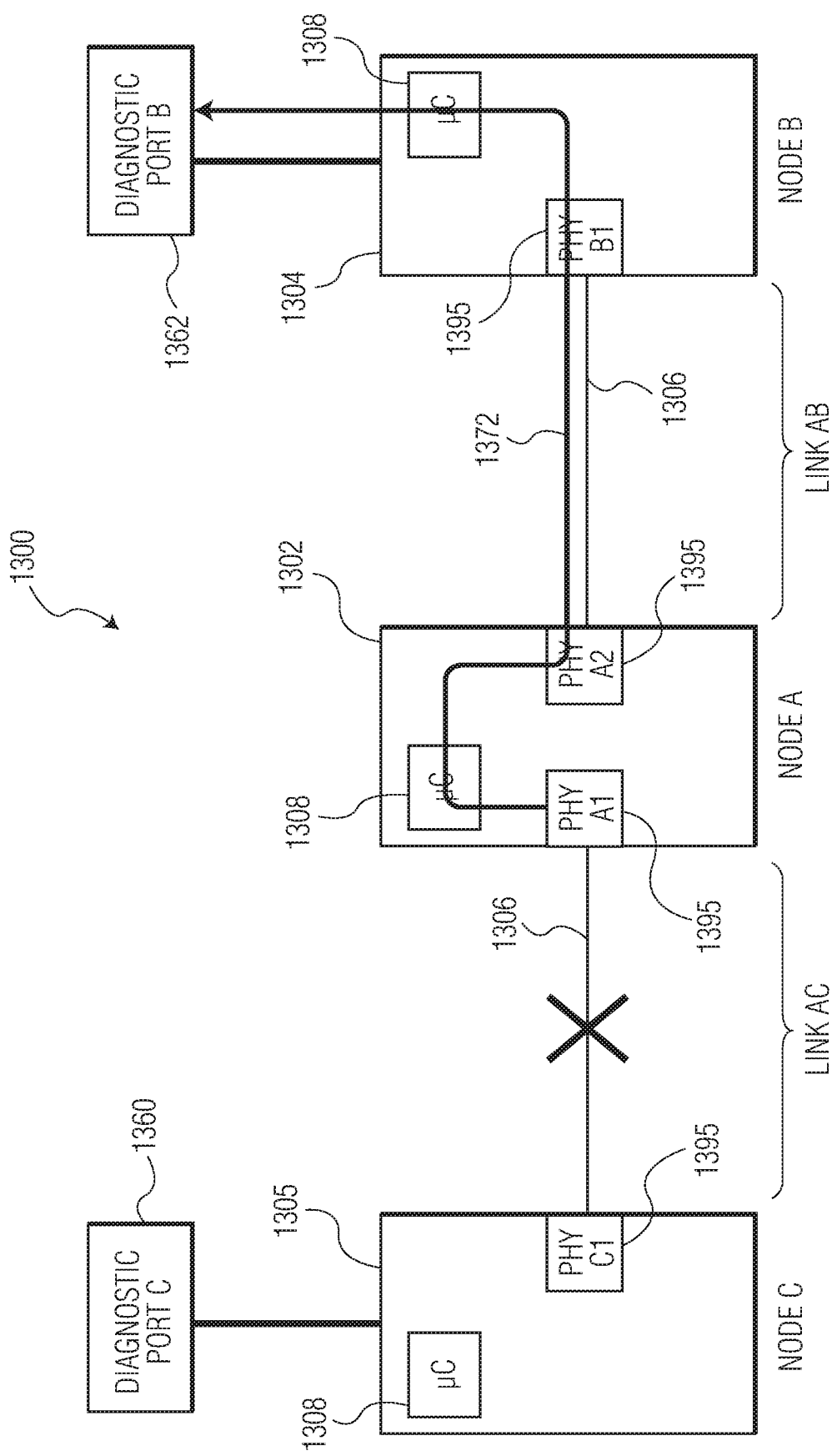

The scenario of FIGS. 13A and 13B is similar to the scenario described above with reference to FIGS. 12A and 12B. In particular, FIGS. 13A and 13B illustrate a scenario in which a register value is stored in the register 1330 of PHY chip A1 1395 of node A 1302 that indicates a fault in the PHY chip or a fault in the link 1306 (e.g., link AC) that is connected to the PHY chip. For example, the fault may be a fault at the PHY chip, such as a low voltage condition or an open/short circuit condition as described above with reference to FIGS. 4-6 or the fault may be a fault detected via loop testing (e.g., internal, external, and/or remote loop testing) as described above with reference to FIGS. 8A-9. With reference to FIG. 13A, the register stores a register value (e.g., Fault=YES) that indicates that there is a fault condition at PHY chip A1 that renders link AC inoperable. The register value is read by the microcontroller 1308 and provided, via the microcontroller, to the register 1330 of PHY chip A2 1395 of node A 1302. As described above, the fault status logic 1387 of PHY chip A2 can then generate a fault code based on the register value stored in its register and embed the fault code as bits of an OAM word into a bit stream as described above. The OAM word, which includes the fault code, is then transmitted from PHY chip A2 of node A onto link AB. The sharing of fault status information from the register of PHY chip A1, through the microcontroller, through PHY chip A2, and on to link AB is illustrated by the continuous arrow 1372.

FIG. 13B illustrates the sharing of fault information from node A 1302 to diagnostic port B 1362 via link AB. In particular, as illustrated by arrow 1372, the fault information is shared from the PHY chip A1 1395 of node A, e.g., from the register of PHY chip A1, through the microcontroller 1308 of node A, through PHY chip A2 of node A, through link AB, through PHY chip B1 of node B 1304, and then through the microcontroller of node B to diagnostic port B. In an embodiment, the fault information is stored in corresponding registers of the PHY chips as register values that are indicative of the particular fault and then encoded into OAM bits and decoded from OAM bits by the fault status logic as described above. In an embodiment, diagnostic port B receives fault status information indicating that there is a fault associated with link AC. In an embodiment, the fault status information may indicate specific details of the particular fault, e.g., a low voltage condition at PHY chip A1, an open/short circuit condition at PHY chip A1, and/or a loopback fault associated with PHY chip A1, e.g., an internal, external, and/or remote loopback error. Diagnostic port B then uses the fault status information to determine a fault status of the communications network. For example, diagnostic port B can determine from the received fault status information that node C is unreachable from node B and that node C is unreachable from node A as indicated by the "X" on link AC.

Figure 14A:
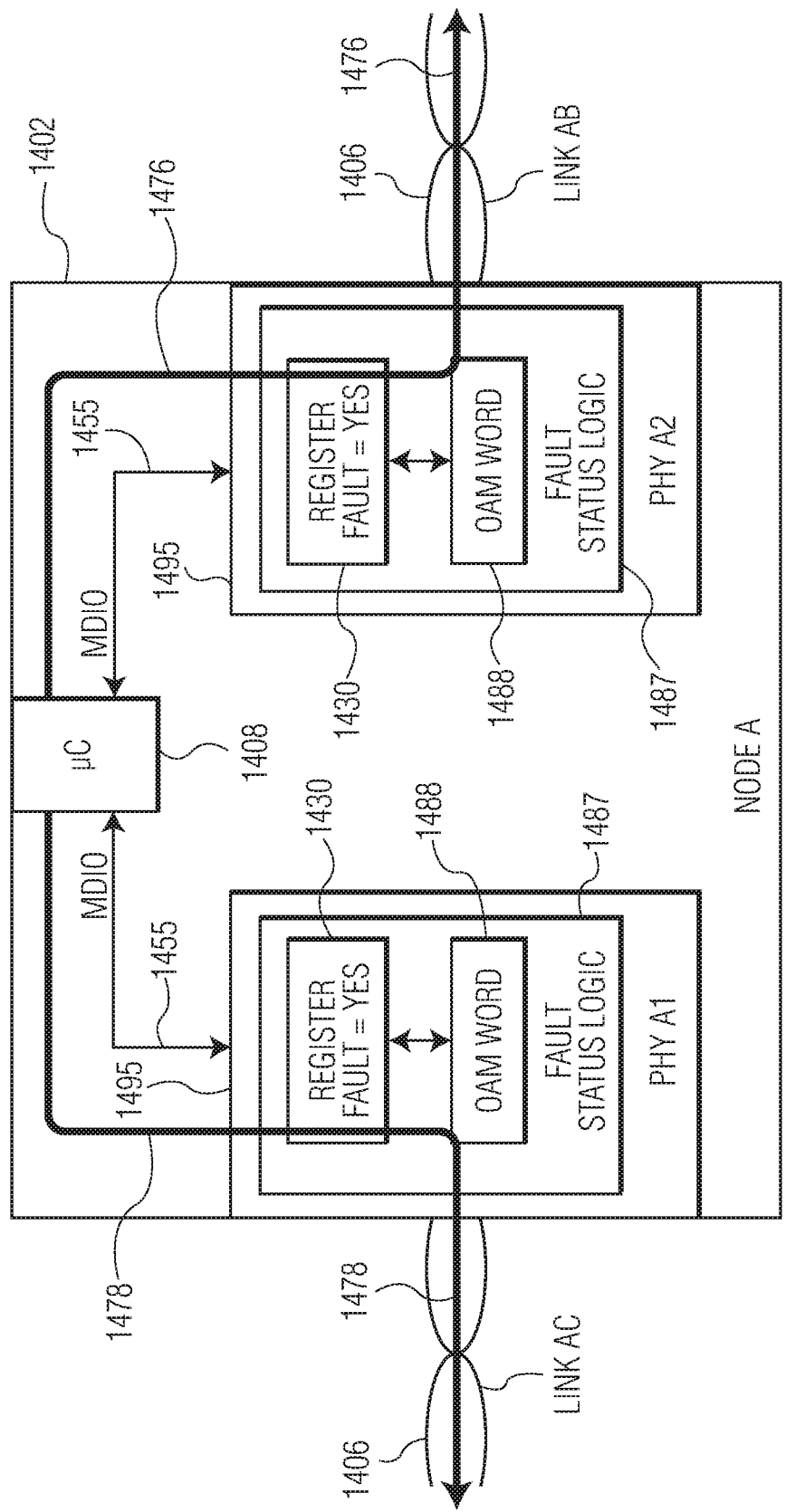
FIGS. 14A and 14B illustrate a scenario in which a register value is stored in the registers of PHY chips A1 and A2 of node A that indicate a fault in the microcontroller of node A.
Figure 14B:
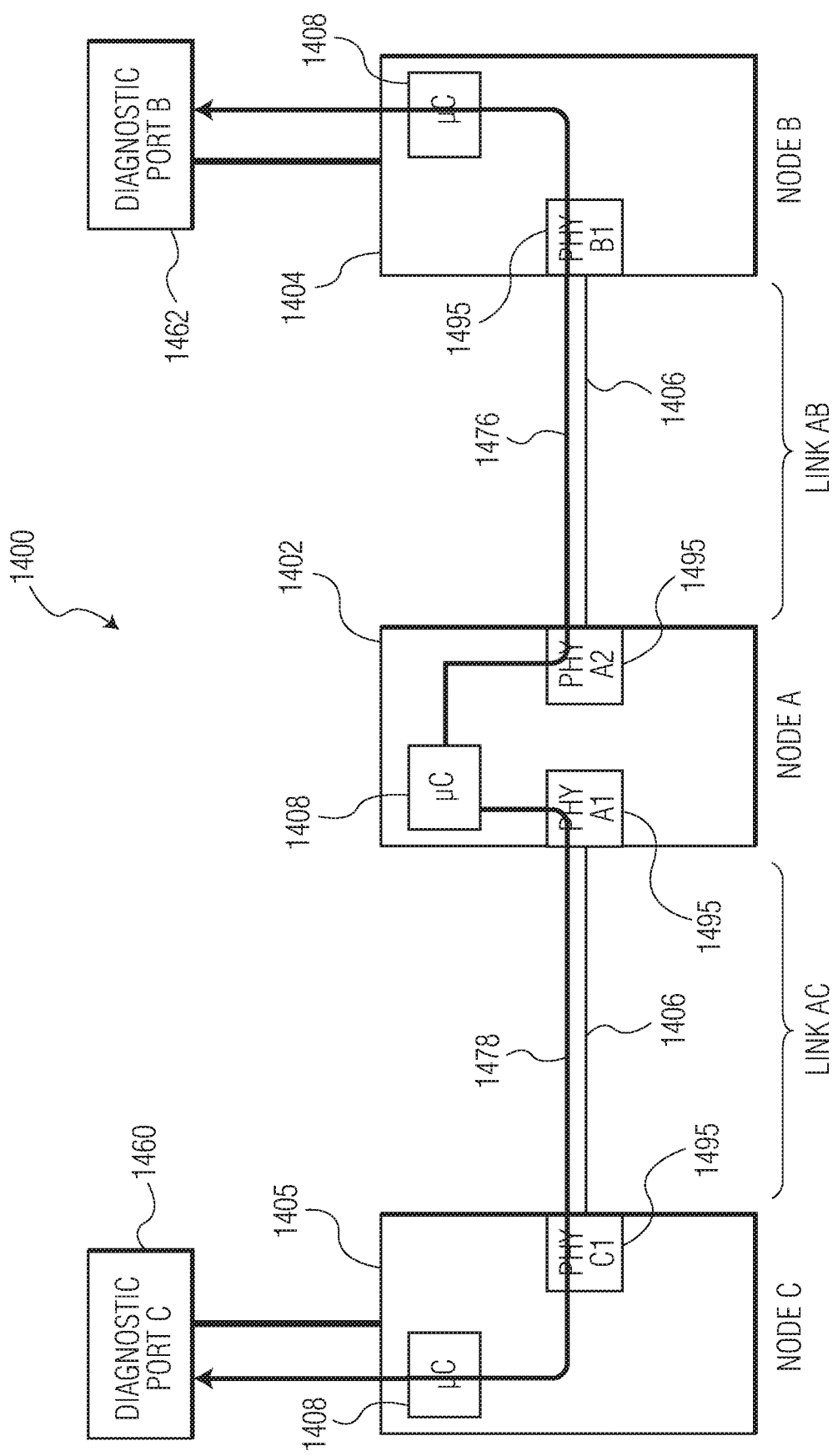

FIGS. 14A and 14B illustrate a scenario in which a register value is stored in the registers of PHY chips A1 and A2 1495 of node A 1402 that indicate a fault in the microcontroller of node A. An example of identifying a fault status related to a faulty microcontroller is described above with reference to FIGS. 4 and 7. With reference to FIG. 14A, it is assumed that there is a fault in the microcontroller 1408 and a register value (e.g., Fault=YES) is set in the registers 1430 of both PHY chip A1 and PHY chip A2 that is indicative of a fault status of the microcontroller. The fault status information is then transmitted from PHY chip A2 via link AB and from PHY chip A1 onto link AC as described above. The sharing of fault status information related to the microcontroller via link AB and link AC is illustrated by the arrows 1476 and 1478, respectively. In an embodiment and as described above, a fault code can be embedded into a bit stream as an OAM word by the PHY chip and transmitted across a link to the PHY chip on the other end of the link. The receiving PHY chip can extract OAM bits from the bit stream, decode the OAM bits, and use the decoded OAM bits to set a register value in the register of the corresponding PHY chip. The microcontroller of the receiving node can read the register value and take some action such as determining a fault status or passing fault status information on to a diagnostic port.

FIG. 14B illustrates the sharing of fault status information from node A 1402 to diagnostic port B 1462 via link AB and from node A to diagnostic port C 1460 via link AC. In particular, as illustrated by arrow 1476, the fault information is shared from the microcontroller 1408 of node A, through PHY chip A2 of node A, e.g., from the register of PHY chip A2, through link AB, through PHY chip B1 of node B 1404, and then through the microcontroller of node B to diagnostic port B and as illustrated by arrow 1478, the fault information is shared from the microcontroller of node A, through PHY chip A1 of node A, e.g., from the register of PHY chip A1, through link AC, through PHY chip C1 of node C, and then through the microcontroller of node C to diagnostic port C. In an embodiment, the fault information is stored in corresponding registers of the PHY chips as register values that are indicative of the faulty microcontroller and then encoded into OAM bits and decoded from OAM bits by the fault status logic of the corresponding PHY chips as described above. As illustrated in FIG. 14B, diagnostic port B and diagnostic port C receive fault status information indicating that node A has a faulty microcontroller. In an embodiment, the fault status information may indicate specific details of the particular fault of the microcontroller of node A, e.g., an electrical fault at the microcontroller, a fault that results in a data pattern that does not make sense to the microcontroller, and/or a fault which results in an error of a state machine. Diagnostic port B and diagnostic port C can use the received fault status information to determine a fault status of the communications network. For example, diagnostic port B may determine from the received fault status information that node A has a faulty microcontroller and therefore node C may be unreachable from node B and that node A may be reachable from node B but that node A may have limited functionality. Likewise, diagnostic port C may determine from the received fault status information that node A has a faulty microcontroller and therefore node B may be unreachable from node C and that node A may be reachable from node C but that node A may have limited functionality.

In an embodiment, a 2-byte register is used to store a 2-byte register value that is used to store and communicate fault status information. For example, the bits of the 2-byte register value can be partitioned as follows: 3-bits to identify subnet, 5-bits to identify the node/PHY chip, 4-bits to identify the type of fault, and 6-bits for parity check. In an example, 4-bits are used to identify the fault type, e.g., a low power condition, an open/short circuit condition, a faulty microcontroller, and/or a loop fault, e.g., internal/external/ remote loop fault. Although an example of a 2-byte register value is provided, a different number of bits (with corresponding register and register values) could be used to communicate fault status information. In an embodiment, the register values are used by the fault status logic (e.g., by the control logic of the fault status logic) to generate an OAM word for transmission across a link and likewise, the fault status logic can convert an OAM word to register value.

In an embodiment, a diagnostic port can read register values from the node and perform certain functions in response to the register values. In an embodiment, the diagnostic ports may provide information to an application (e.g., an application running on a microcontroller or on an ASIC), process the register values to understand a status of the network, access a level of severity of a particular fault, and/or recommend actions of next steps through, for example, writing to the registers.

Figure 15:
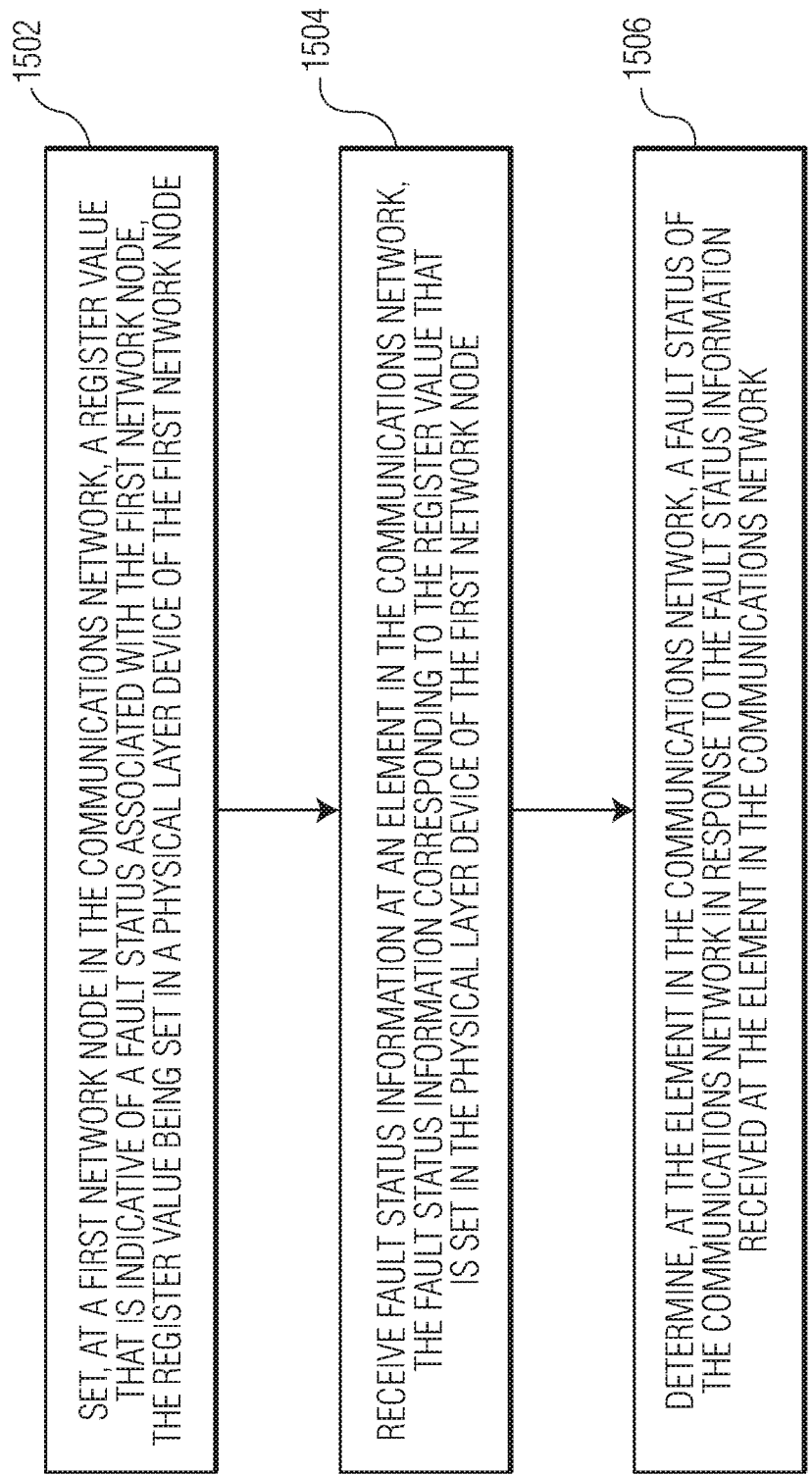
FIG. 15 is a process flow diagram of an example method for operating a communications network.

FIG. 15 is a process flow diagram of an example method for operating a communications network. In an embodiment, at block 1502, at a first network node in the communications network, a register value is set that is indicative of a fault status associated with the first network node, the register value being set in a physical layer device of the first network node. At block 1504, fault status information is received at an element in the communications network, the fault status information corresponding to the register value that is set in the physical layer device of the first network node. At block 1506, at the element in the communications network, a fault status of the communications network is determined in response to the fault status information received at the element in the communications network.

The above-described operations of the fault status logic can be implemented in hardware, firmware, software, or a combination thereof. In an embodiment, the error management logic is implemented in a PHY chip with hardware logic circuits. In another embodiment, the PHY chip may include an instruction processor and the error management logic can be implemented through computer readable instructions that are executed by the instruction processor.

In an embodiment, OAM bits are used by a receiving node to learn the status of the physical layer (e.g., the PHY chip) of a transmitting node and/or to communicate certain defined/agreed actions. The OAM bits can be used to communicate between two PHY chips to agree on the timing to start a new configuration.

In an embodiment, the elements of the physical layer as described above are integrated into an IC device, referred to as a PHY device. In an embodiment, the elements of the physical layer as described above can be integrated into an IC device that includes other functionality, such as microprocessor functionality. For example, the components of a traditional PHY chip can be integrated onto a System-on-Chip (SoC).

In an embodiment, the OAM bits are used to pass information from a local PHY chip to a remote PHY chip. As shown in FIG. 10A, the OAM bits are embedded into the bit stream of data that is received from a higher layer, e.g., from the data link layer. The OAM bits may include information related to, for example, node health, control, managing link partners, interoperability, and interleaving.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for operating a communications network, the method comprising:
    setting, at a first network node in the communications network, a register value that is indicative of a fault status associated with the first network node, the register value being set in a physical layer device of the first network node;
    receiving fault status information at an element in the communications network, the fault status information corresponding to the register value that is set in the physical layer device of the first network node; and
    determining, at the element in the communications network, a fault status of the communications network in response to the fault status information received at the element in the communications network;
    further comprising, at the first network node:
    reading the register value that is set in the physical layer device;
    based on the read register value, embedding an indication of the fault status into a bit stream at the physical layer of the first network node; and
    transmitting the bit stream from the first network node;
    wherein embedding an indication of the fault status into a bit stream at the physical layer comprises forming a frame which comprises an operations, administration, and management (OAM) word and payload data, the OAM word to be communicated from the physical layer of the first network node to a physical layer of a second network node and not to a data link layer of the second network node, the payload data received from a data link layer of the first network node and to be communicated to the data link layer of the second network node, the frame embedded in the bit stream to communicate the indication of the fault status; wherein the frame is embedded into the bit stream at a physical coding sublayer transmitter (PCS-TX) of the first network node; and wherein the indication of fault status comprises one or more bits to identify a subnet associated with the fault status, one or more bits to identify a physical layer chip associated with the fault status, one or bits to identify a type of fault, and one or more bits of parity check.

2. A communications network comprising:
    multiple network nodes, the multiple network nodes including a physical layer device, the physical layer device comprising:
        a transmitter configured to transmit a bit stream from the physical layer device, the transmitter including a physical coding sublayer transmitter (PCS-TX);
        a receiver configured to receive a bit stream at the physical layer device; and
        fault status logic that includes a register for storing a register value that is indicative of a fault status associated with the network node;
    wherein at least one element in the communications network is configured to determine a fault status of the communications network in response to the register value that is stored in the register of the fault status logic;
    wherein the fault status logic is configured to;
    identify a fault status at a first network node;
    set the register with a register value that is indicative of the fault status; and
    provide an indication of the identified fault status to the transmitter;
    wherein the transmitter is configured to form a frame which comprises an operations, administration, and management (OAM) word and a payload data, the OAM word to be communicated from a physical layer of one network node to a physical layer of another network node and not to a data link layer of the other network node, the payload data received from a data link layer of the one network node and to be communicated to the data link layer of the other network node, the frame embedded into a bit stream at the PCS-TX of the transmitter of the first network node before transmission of the bit stream, the OAM word including the indication of the fault status provided by the fault status logic; and wherein the indication of fault status comprises one or more bits to identify a subnet associated with the fault status, one or more bits to identify a physical layer chip associated with the fault status, one or bits to identify a type of fault, and one or more bits of parity check.

3. A communications network comprising:
    a first network node including a physical layer device, the physical layer device comprising:
        a transmitter configured to transmit a bit stream from the physical layer device, the transmitter including a physical coding sublayer transmitter (PCS-TX);
        a receiver configured to receive a bit stream at the physical layer device; and
        fault status logic that includes a register for storing a register value that is indicative of a fault status associated with the network node, the fault status logic configured to provide to the transmitter an indication of the fault status that corresponds to the stored register value:
    a second network node including a physical layer device, the physical layer device comprising:
        a transmitter configured to transmit a bit stream from the physical layer device, the transmitter including a PCS-TX;

a receiver configured to receive a bit stream at the physical layer device; and fault status logic that includes a register for storing a register value that is indicative of a fault status associated with the network node, the fault status logic configured to provide to the transmitter an indication of the fault status that corresponds to the stored register value;

wherein at least one element in the communications network is configured to determine a fault status of the communications network in response to a register value that is stored in the register of the fault status logic of at least one of the first network and the second network node;

wherein the transmitters are configured to form a frame which comprises an operations, administration, and management (OAM) word and payload data, the OAM word to be communicated from a physical layer of the first network node to a physical layer of the second network node and not to a data link layer of the second network node, the payload data received from a data link layer of the first network node and to be communicated to the data link layer of the second network node, the frame embedded into a bit stream at the PCS-TX before transmission of the bit stream, the OAM word including the indication of the fault status provided by the fault status logic based on the register value stored in the register; and wherein the indication of fault status comprises one or more bits to identify a subnet associated with the fault status, one or more bits to identify a physical layer chip associated with the fault status, one or bits to identify a type of fault, and one or more bits of parity check.

4. The method of claim 1, further comprising:

receiving the bit stream at a receiver of the second network node;

at the second network node, extracting the indication of the fault status from the bit stream;

providing the indication of the fault status to the element in the communications network; and determining a network fault status of the communications network at the element in the communications network in response to the fault status information received at the second network node from the first network node, the network fault status of the communications network indicating whether certain network nodes of the communication network are unreachable based on the fault status.

5. The method of claim 1, further comprising, at the second network node:

receiving the bit stream at a receiver of the second network node;

extracting the indication of the fault status from the bit stream;

configuring the second network node using the indication of the fault status; and operating the second network node as configured using the indication of the fault status.

6. The method of claim 1, further comprising detecting a low voltage condition at the physical layer device of the first network node and setting the register value in response to detecting the low voltage condition.

7. The method of claim 1, further comprising detecting an open/short circuit condition at the physical layer device of the first network node and setting the register value in response to detecting the open/short circuit condition.

8. The method of claim 1, further comprising performing a loop test at the first network node and setting the register value in response to the loop test.

9. The method of claim 1, wherein the register value is indicative of a fault in the physical layer device of the first network node.

10. The method of claim 1, wherein the register value is indicative of a fault in a microcontroller of the first network node.

11. The communications network of claim 2, further comprising a low voltage detector configured to detect a low voltage condition in a physical layer device and to provide an indication of the low voltage condition to the corresponding fault status logic.

12. The communications network of claim 2, further comprising an open/short circuit detection circuit configured to detect an open/short circuit condition in a physical layer device and to provide an indication of the open/short circuit condition to the corresponding fault status logic.

13. The communications network of claim 2, further comprising a loopback testing circuit and wherein the fault status logic comprises a register for storing a result of a loopback test that is performed using the loopback testing circuit.

14. The communications network of claim 2, wherein the fault status logic comprises a microcontroller evaluation circuit configured to evaluate a fault status of a microcontroller.

15. The method of claim 1, wherein the frame further comprises parity bits associated with one or more of the OAM word and payload data.

* * * * *